(12) United States Patent
Vadnerkar et al.

(10) Patent No.: US 10,958,171 B2
(45) Date of Patent: Mar. 23, 2021

(54) MAINTAINING OUTPUT VOLTAGE OF DC-DC CONVERTER IN DISCONTINUOUS CONDUCTION MODE

(71) Applicant: Cirrus Logic International Semiconductor Ltd., Edinburgh (GB)

(72) Inventors: Sarang Vadnerkar, Austin, TX (US); Ullas Pazhayaveetil, Cedar Park, TX (US); Theodore M. Burk, Austin, TX (US); Jeffrey May, Dripping Springs, TX (US)

(73) Assignee: Cirrus Logic, Inc., Austin, TX (US)

( * ) Notice: Subject to any disclaimer, the term of this patent is extended or adjusted under 35 U.S.C. 154(b) by 312 days.

(21) Appl. No.: 15/986,200

(22) Filed: May 22, 2018

(65) Prior Publication Data

US 2018/0337601 A1 Nov. 22, 2018

Related U.S. Application Data

(60) Provisional application No. 62/509,550, filed on May 22, 2017.

(51) Int. Cl.
| | |
|---|---|
| *H02M 3/158* | (2006.01) |
| *H02M 3/157* | (2006.01) |
| *H02M 1/44* | (2007.01) |
| *H02M 3/156* | (2006.01) |
| *H02M 1/08* | (2006.01) |

(Continued)

(52) U.S. Cl.
CPC ............. *H02M 3/158* (2013.01); *H02M 1/08* (2013.01); *H02M 1/44* (2013.01); *H02M 3/156* (2013.01); *H02M 3/157* (2013.01); *H03F 1/025* (2013.01); *H03F 1/0227* (2013.01); *H03F 3/181* (2013.01); *H02M 3/1584* (2013.01); *H02M 2001/0009* (2013.01); *H02M 2001/0012* (2013.01);

(Continued)

(58) Field of Classification Search
CPC ..... H02M 3/157; H02M 3/158; H02M 3/1584
USPC .......................................... 323/271–289, 315
See application file for complete search history.

(56) References Cited

U.S. PATENT DOCUMENTS

| | | | |
|---|---|---|---|
| 6,127,816 A | 10/2000 | Hirst | |
| 6,215,288 B1 * | 4/2001 | Ramsey | H02M 3/1588 323/224 |

(Continued)

OTHER PUBLICATIONS

International Search Report and Written Opinion of the International Searching Authority, International Application No. PCT/GB2018/051383, dated Sep. 10, 2018.

*Primary Examiner* — Thienvu V Tran
*Assistant Examiner* — Nusrat Quddus
(74) *Attorney, Agent, or Firm* — Jackson Walker L.L.P.

(57) ABSTRACT

A DC-DC converter and a corresponding method for maintaining an output voltage of the DC-DC converter, wherein the DC-DC converter is configured to operate in a discontinuous conduction mode, within a predetermined voltage range. The method comprises adjusting a duty cycle of the DC-DC converter based on the output voltage to maintain the output voltage within a predetermined voltage range; wherein the duty cycle of the DC-DC converter is adjusted by switching between a first switching frequency to a second switching frequency, and the first switching frequency and the second switching frequency are selected such that the first switching frequency and the second switching frequency fall outside of at least one predefined disallowed frequency band.

26 Claims, 20 Drawing Sheets

(51) Int. Cl.
*H03F 1/02* (2006.01)
*H03F 3/181* (2006.01)
*H02M 1/00* (2006.01)

(52) U.S. Cl.
CPC .............. *H02M 2001/0032* (2013.01); *H02M 2001/0048* (2013.01)

(56) References Cited

U.S. PATENT DOCUMENTS

| | | | | |
|---|---|---|---|---|
| 7,944,716 | B2* | 5/2011 | Halberstadt | H02M 3/3376 363/25 |
| 8,867,047 | B2* | 10/2014 | Hotogi | H02M 3/335 358/1.1 |
| 2006/0097685 | A1* | 5/2006 | Shin | H02P 8/12 318/696 |
| 2009/0206805 | A1* | 8/2009 | Choi | H02M 3/1584 323/271 |
| 2010/0033143 | A1* | 2/2010 | Asuncion | H02M 3/156 323/247 |
| 2010/0109543 | A1* | 5/2010 | Kumagai | H05B 41/2883 315/224 |
| 2010/0130273 | A1* | 5/2010 | Koyama | H01Q 1/243 455/575.7 |
| 2010/0141228 | A1* | 6/2010 | Lopata | H02M 3/1588 323/282 |
| 2012/0014148 | A1* | 1/2012 | Li | H02M 1/4216 363/78 |
| 2012/0153919 | A1* | 6/2012 | Garbossa | H02M 3/156 323/284 |
| 2012/0313430 | A1* | 12/2012 | Wu | H02M 3/3376 307/9.1 |
| 2014/0035654 | A1 | 2/2014 | Jiang et al. | |
| 2014/0354257 | A1 | 12/2014 | Paul et al. | |
| 2015/0229211 | A1 | 8/2015 | Walsh et al. | |
| 2016/0066375 | A1* | 3/2016 | Seki | H05B 33/0815 315/224 |
| 2016/0365801 | A1* | 12/2016 | Phadke | H02M 3/33546 |
| 2017/0033707 | A1* | 2/2017 | Nishijima | H02M 7/06 |
| 2019/0318784 | A1* | 10/2019 | Lee | G11C 16/26 |

* cited by examiner

MAINTAINING OUTPUT VOLTAGE OF DC-DC CONVERTER IN DISCONTINUOUS CONDUCTION MODE

TECHNICAL FIELD

Embodiments disclosed herein relate to methods and apparatus for adapting DC-DC converter switching frequencies to maintain operation outside of predefined disallowed frequency bands.

BACKGROUND

Portable devices are becoming more common in every aspect of our lives. For example, many consumers listen to their music from portable audio players. These portable devices become easier and more enjoyable to use when they are provided in small packages, offering the same capabilities while still having long lasting battery charge. To support these longer lasting devices, the operating voltage of many of the components inside is often reduced to reduce the power consumption. However, this reduction in operating voltage may affect the sound output of the portable device as the volume level of an audio signal is proportional to the output voltage. A boost converter may therefore be used to increase the operating voltage for select components within a portable device that would benefit from higher operating voltages, for example, audio amplifiers which may require high voltages to provide high volumes.

FIG. 1 illustrates a conventional audio amplifier comprising a boost converter. The audio amplifier comprises a battery supply 102 which is configured to provide a voltage $V_p$ to a boost converter 104. The boost converter 104 increases the voltage $V_p$ to a boost voltage $V_{bst}$. In this example, a speaker amplifier 108 is configured to receive the boost voltage $V_{bst}$ and output an analog audio signal sig from a digital to analog converter (DAC). The speaker amplifier increases the low power signal sig with the power received from the boost converter to generate a signal to drive a speaker 110. The boost voltage $V_{bst}$ is higher than the supply voltage $V_p$ which allows the speaker amplifier 108 to provide louder audio signals through the speaker 110 than would be possible using only the supply voltage $V_p$.

Portable devices are becoming increasingly complex systems where the ability of a given integrated circuit to co-exist with a neighbouring integrated circuit (IC) on a printed circuit board or in a physically adjacent area may become increasingly important to the system or device designer. Interference between the operation of any two ICs may occur not necessarily due to a direct connection between the two, but due to electromagnetic interference produced by one in a frequency or frequency range where operation of the other is susceptible to interference. A boost converter may for instance create a large switching voltage as a part of the $V_{bst}$ generation process. This switching voltage can often cause electromagnetic interference with other nearby ICs or other sub-systems on the portable device. The boost converter may also create noise in the battery supply ($V_p$) each time it switches. This switching can cause noise to be injected onto a power supply which may be shared by other ICs in a portable device. Some ICs are more susceptible than others to noise on the power supply and performance can suffer as a result. As the portable devices become increasingly complex, so do the requirements to avoid multiple frequency bands of operation.

SUMMARY

According to embodiments described herein there is provided a method for maintaining an output voltage of a DC-DC converter, configured to operate in a discontinuous conduction mode, within a predetermined voltage range. The method comprises adjusting a duty cycle of the DC-DC converter based on the output voltage to maintain the output voltage within a predetermined voltage range; wherein the duty cycle of the DC-DC converter is adjusted by switching between a first switching frequency to a second switching frequency, and the first switching frequency and the second switching frequency are selected such that the first switching frequency and the second switching frequency fall outside of at least one predefined disallowed frequency band.

According to some embodiments there is provided a DC-DC converter configured to in a discontinuous conduction mode and to maintain an output voltage within a predetermined voltage range. The DC-DC converter comprises a controller, wherein the controller comprises an input configured to receive an indication of the output voltage; and an adjustment block configured to adjust a duty cycle of the DC-DC converter based on the output voltage to maintain the output voltage within a predetermined voltage range; wherein the duty cycle of the DC-DC converter is adjusted by switching between a first switching frequency to a second switching frequency, and the first switching frequency and the second switching frequency are selected such that the first switching frequency and the second switching frequency fall outside of at least one predefined disallowed frequency band.

BRIEF DESCRIPTION OF THE DRAWINGS

For a better understanding of the present invention, and to show how it may be put into effect, reference will now be made, by way of example only, to the accompanying drawings, in which:—

DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 1:
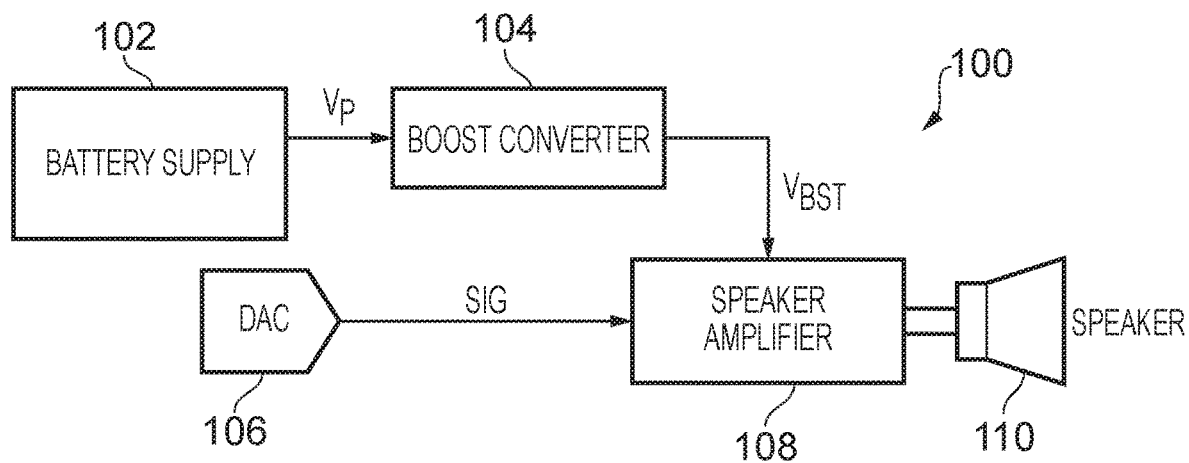
FIG. 1 is an example of a conventional audio amplifier comprising a boost converter in accordance with the prior art.
Figure 2:
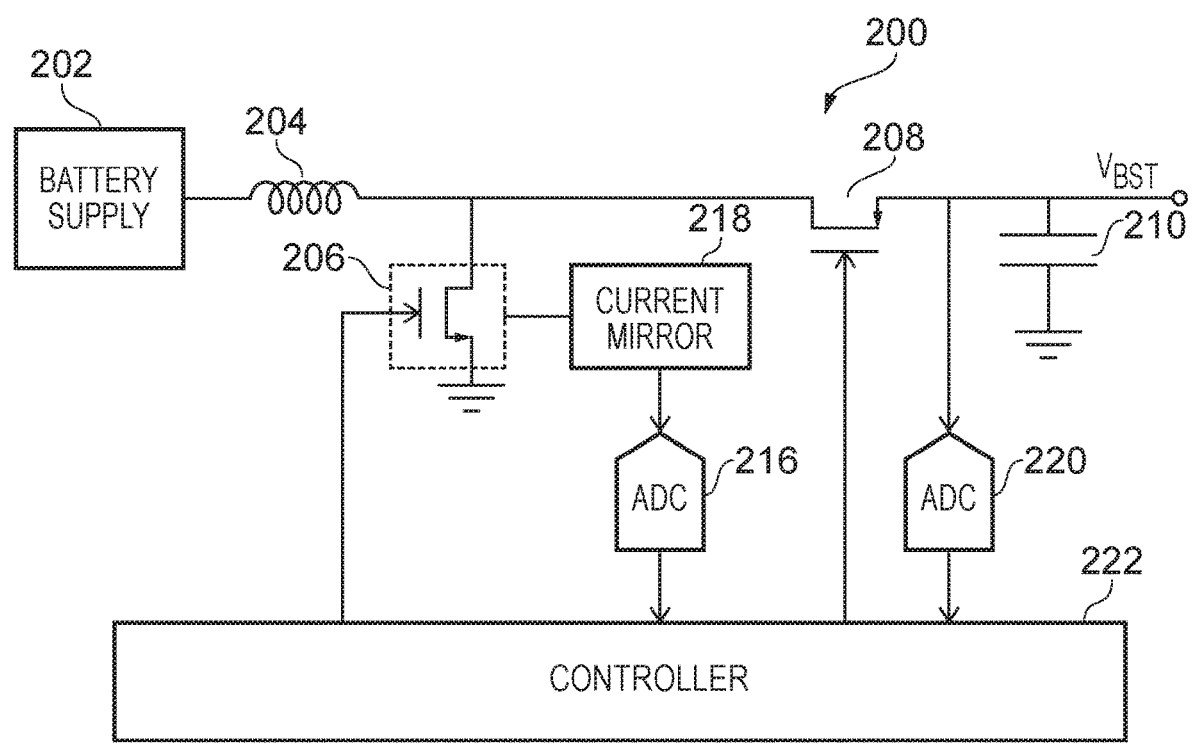
FIG. 2 is an example block diagram of a DC-DC converter in accordance with the present disclosure.

FIG. 2 illustrates an example DC-DC converter 200 in accordance with some embodiments of the present disclosure. The DC-DC converter 200 comprises a battery supply 202 which provides a supply voltage $V_P$ to the DC-DC converter 200. The DC-DC converter 200 comprises an inductor 204 connected to the battery supply 202. The DC-DC converter 200 further comprises two switches 206 and 208 and a capacitor 210. The switches 206 and 208 are in this example implemented as an n-channel field effect transistor (NFET) 206 and a p-channel field effect transistor (PFET) 208.

In this example implementation, the inductor 204 is coupled to the drain of the PFET 208 and the drain of the NFET 206. The drain of the PFET 208 and the drain of the NFET 206 are also coupled together.

The capacitor 210 is coupled between the source of the PFET 208 and ground. The source of the NFET 206 is coupled to ground. Both the gate of the PFET 208 and the gate of the NFET 206 are coupled to a level shifting and driving block 214 which controls whether the PFET and NFET are in conducting or non-conducting states. An amplifier or other signal processing circuitry may be connected to receive the boost voltage from the source of the PFET 208.

For example, during a first time period, the NFET 206 may be switched on to a conducting state which couples the inductor 204 to ground, while the PFET 208 is switched off to a non-conducting state. This switching configuration causes the supply voltage $V_P$ to fall across the inductor 204 and therefore cause current to flow through the inductor 204 thereby storing energy in the inductor.

During a second time period, the NFET 206 may be switched off into a non-conducting state while the PFET 208 may be switched on to a conducting state. This switching configuration causes the inductor to couple to ground through the capacitor 210. Thus, the energy stored in the inductor 204 during the first time period is transferred to the capacitor 210 during the second time period. As energy is stored in the capacitor 210, the voltage across the capacitor increases and allows the boost voltage $V_{bst}$ to increase beyond the supply voltage $V_P$.

A controller 222 may control the duration of the first and second time periods in order to regulate the transfer of power from the inductor to the capacitor and thus regulate the level of the boost voltage $V_{bst}$.

It will be appreciated that such a boost converter may operate in two distinct modes: continuous conduction mode, CCM and discontinuous conduction mode, DCM.

Figure 3A:
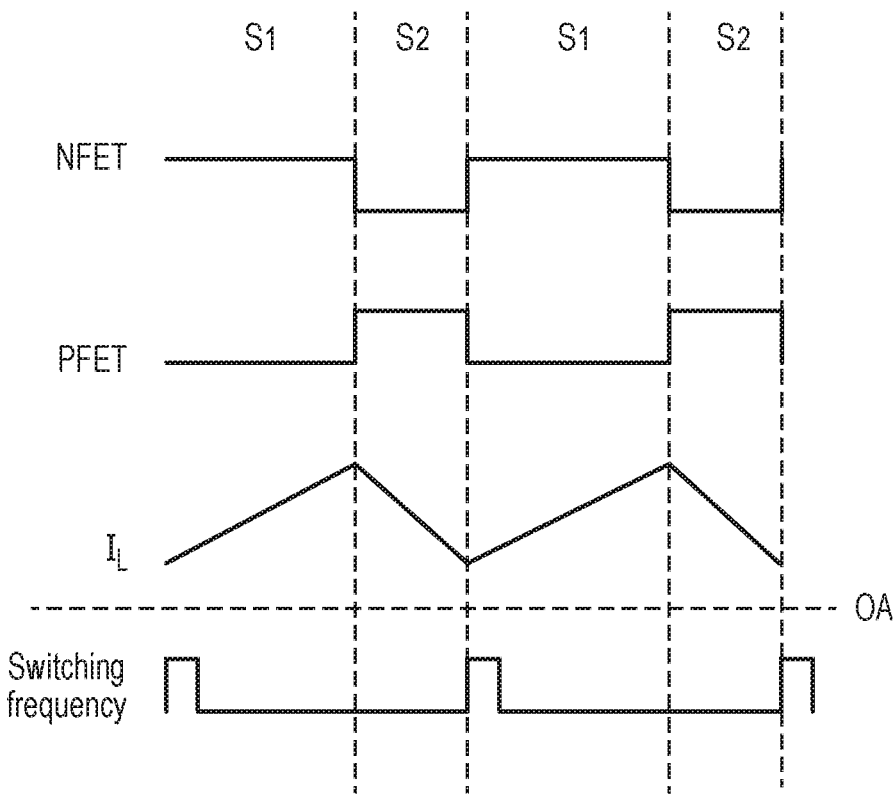
FIG. 3a is an example timing diagram illustrating the operation of a boost converter in a continuous conduction mode, CCM, in accordance with embodiments of the present disclosure.

FIG. 3a illustrates the operation of a boost converter in a continuous conduction mode, CCM. In this state, the boost converter operates with two switching states $S_1$ and $S_2$ per switching cycle. As previously described during state $S_1$, NFET 206 is in a conducting state and PFET 208 is in a non-conducting state. During this period, the current is drawn across the inductor storing energy in the conductor. In switching state $S_2$, as described previously, the PFET 208 is in a conducting state and the NFET 206 is in a non-conducting state. During this period, the energy stored in the inductor is transferred to the capacitor and the current through the inductor drops.

The controller may control the length of the duty cycle in order to maintain the output voltage within a predetermined range. In other words, if $V_{bst}$ goes too high, the time spent in state $S_1$ may be reduced and if $V_{bst}$ drops below a minimum voltage $V_{min}$, then the time spent in state $S_1$ may be increased.

In some examples, the switching state is switched from state $S_1$ to state $S_2$ when the current across the inductor reaches a maximum value. The switching state may be switched from state $S_2$ to state $S_1$ at the beginning of each clock cycle as illustrated by the begin switching frequency cycle pulses in FIG. 3a.

Figure 3B:
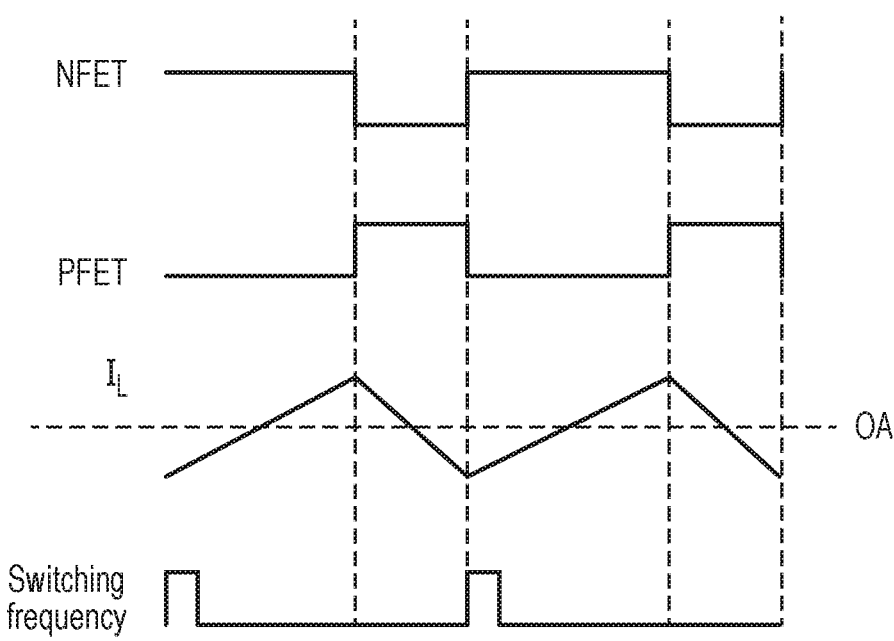
FIG. 3b is an example timing diagram illustrating the operation of a boost converter in a continuous conduction mode, CCM, in accordance with embodiments of the present disclosure.

However, when the load current decreases, in other words a higher resistance is coupled to receive the boost voltage $V_{bst}$, the inductor current also decreases. In this case, if the boost converter is left to operate in continuous conduction mode, then the inductor current may become negative in each switching period, as illustrated in FIG. 3b. This negative current may waste power by passing unnecessary current across the inductor.

The boost converter may therefore be operated in discontinuous conduction mode (DCM). In DCM, there may be, for example, three different switching states. States $S_1$ and $S_2$ are the same as illustrated for CCM in FIGS. 3a and 3b, but in third state $S_3$, both the NFET 206 and the PFET 208 are off.

Figure 4:
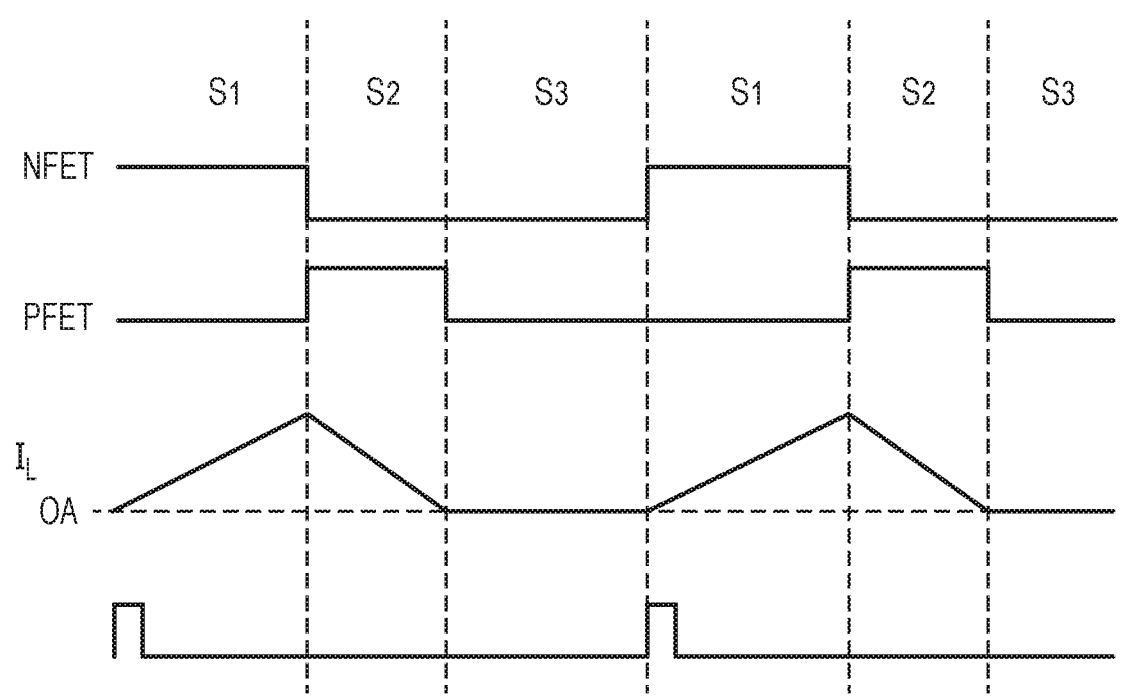
FIG. 4 is an example timing diagram illustrating the operation of a boost converter in discontinuous conduction mode, DCM, in accordance with embodiments of the present disclosure.

As the PFET 208 is switched off, this switch deactivation stops any current flowing back through the inductor in a negative direction, thereby pinning or maintaining the inductor current at 0 A as illustrated in FIG. 4. This mode thereby avoids the power wasted by the negative current through the inductor illustrated in FIG. 3b.

Figure 5:
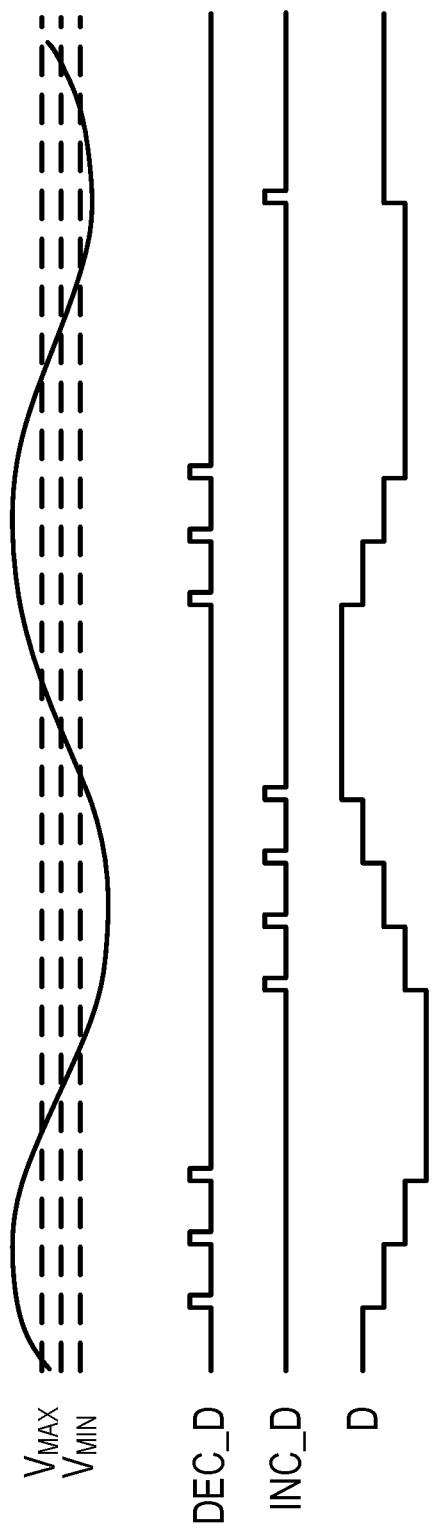
FIG. 5 is an example timing diagram illustrating the operation of the DC-DC converter in DCM, in accordance with embodiments of the present disclosure.

FIG. 5 illustrates an example of the operation of the DC-DC converter in DCM.

In this example, the DC-DC converter is configured to maintain the boost voltage $V_{BST}$ within the predetermined voltage range between a maximum voltage $V_{Max}$ and a minimum voltage $V_{MIN}$. Therefore, when the voltage goes above the maximum voltage $V_{MAX}$, the DC-DC converter may decrease the duty cycle of the DC-DC converter. In other words, the controller 222 illustrated in FIG. 2 may decrease the amount of time spent in switching state $S_1$. This time decrease will reduce the energy stored in the inductor during the switching period, and therefore reduce the energy transferred to the capacitor, thereby reducing the boost voltage $V_{BST}$.

Equivalently, when the voltage drops below the minimum voltage $V_{MIN}$, the DC-DC converter may increase the duty cycle of the DC-DC converter. In other words, the controller 222 illustrated in FIG. 2 may increase the amount of time spent in switching state $S_1$. This time increase will increase the energy stored in the inductor during the switching period, and therefore increase the energy transferred to the capacitor, thereby increasing the boost voltage $V_{BST}$.

According to some embodiments, it may also be desirable, for low enough loads, to reduce the switching frequency in order to further reduce the power consumption of the boost converter. By reducing the switching frequency, the time spent in the state $S_3$ can be increased, thereby saving more power by not wasting current across the inductor.

Furthermore, a lower switching frequency reduces the power consumption across the capacitor.

Figure 6:
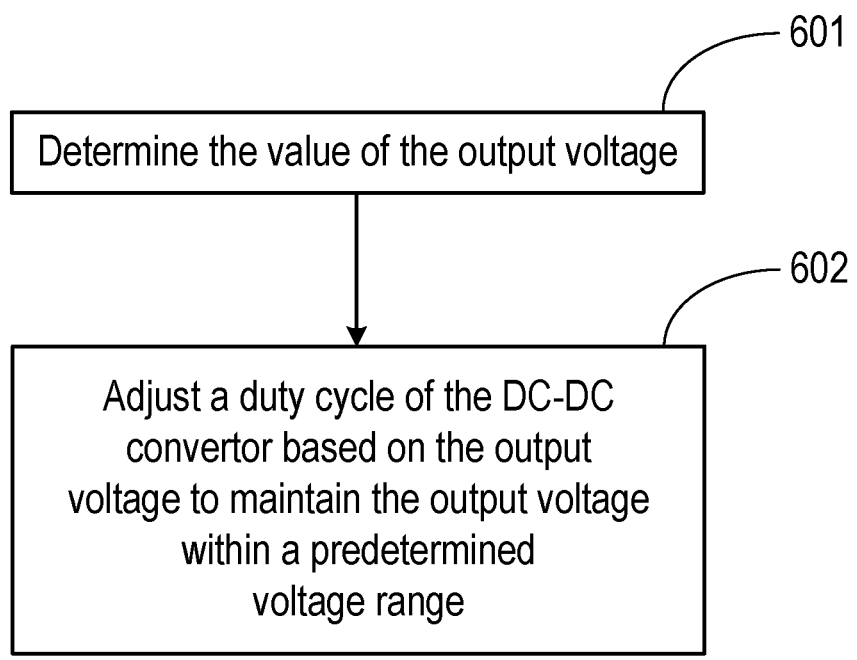
FIG. 6 is an example flow chart diagram illustrating a method for maintaining an output voltage of a DC-DC converter in a predetermined voltage range, while operating in a discontinuous conduction mode, in accordance with embodiments of the present disclosure.

FIG. 6 illustrates a method for maintaining an output voltage of a DC-DC converter in a predetermined voltage range, while operating in a discontinuous conduction mode, for example as illustrated in FIG. 4.

In step 601, the DC-DC convertor determines the value of the output voltage of the DC-DC convertor.

In step 602, the DC-DC converter adjusts a duty cycle of the DC-DC converter based on the output voltage to maintain the output voltage within a predetermined voltage range. For example, the duty cycle of the DC-DC converter may be adjusted by switching between a first switching frequency and a second switching frequency. The first switching frequency and the second switching frequency may be selected such that the first switching frequency and the second switching frequency fall outside of at least one predefined disallowed frequency band.

For example, in some embodiments at least one predefined disallowed frequency band may be in place which comprises frequencies which should not be used by the DC-DC converter. For example, one or more frequencies in the at least one predefined disallowed frequency band may be used for integrated circuits with some other application within a device comprising the DC-DC converter. In some embodiments, the electromagnetic interference (EMI) with switching frequencies within the predefined disallowed frequency bands is unpredictable, and therefore it may be desirable to avoid using the frequencies within the predefined disallowed frequency bands. Therefore, the embodiments disclosed herein allow the boost converter's switching frequency and duty cycle to be manipulated in order to avoid electromagnetic interference or power supply noise injection which can be problematic for other sub-systems or ICs within the portable device.

When changing switching frequencies to decrease or increase the duty cycle of the DC-DC converter, the frequencies may also be selected such that the time period of the switching frequencies are multiples of the time period of the clock frequency used by the DC-DC converter. In this way, the switching periods of the lower frequencies will comprise an integer number of clock periods.

For example, consider a DC-DC converter utilizing a clock frequency of X kHz. This high frequency may be used as the highest switching frequency available to the DC-DC converter. The second switching frequency may then be X/2 kHz. A third switching frequency of X/3 kHz may also be available, and so on.

The time period of the first switching frequency, which is equal to the clock frequency, will be 1/X seconds. The time period of the second frequency will be 2/X seconds, and the time period of the third switching frequency will be 3/X seconds, and so on.

These switching frequencies may therefore comprise an integer number of clock cycles.

Figure 7:
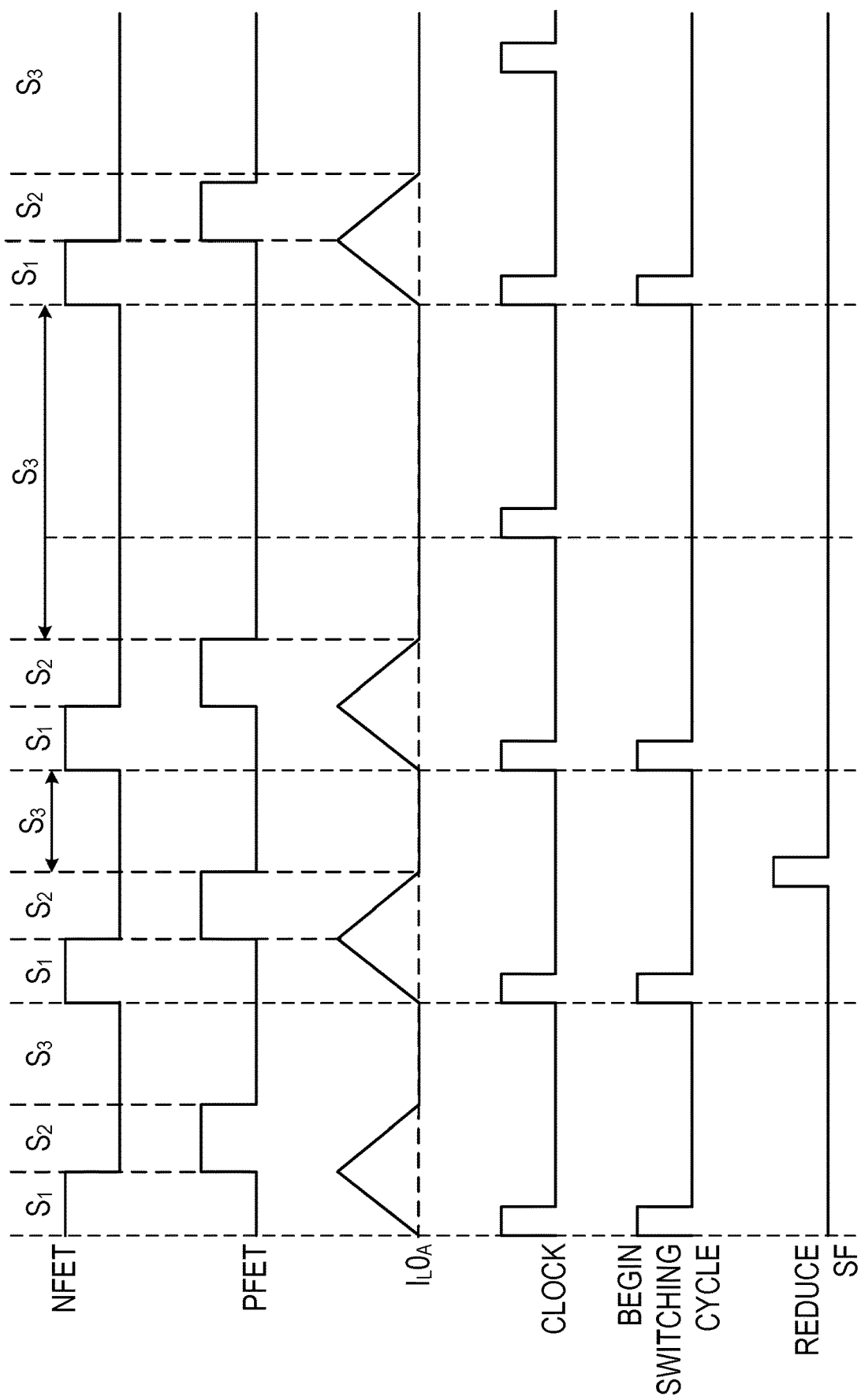
FIG. 7 is an example timing diagram illustrating the operation of a DC-DC converter when switching from a first switching frequency to a second switching frequency, in accordance with embodiments of the present disclosure.

Therefore, when switching from the first switching frequency to the second switching frequency, the DC-DC converter effectively skips a switching period as illustrated in FIG. 7.

FIG. 7 illustrates the operation of a DC-DC converter when switching from a first switching frequency equal to the clock frequency, to a second switching frequency.

In the first and second illustrated clock periods, the DC-DC converter is operating with the first switching frequency. However, mid-way through the second clock cycle, the DC-DC converter decides to lower the switching frequency, potentially due to the boost voltage $V_{BST}$ being above the maximum voltage threshold $V_{MAX}$ as illustrated in FIG. 5.

The DC-DC converter may then switch to the second switching frequency for the $3^{rd}$ to the $6^{th}$ clock cycles. It can be seen that the second switching frequency effectively skips the $4^{th}$ clock cycle and the $6^{th}$ clock cycle by staying the third switching state $S_3$ and pinning the inductor current to zero.

Figure 8:
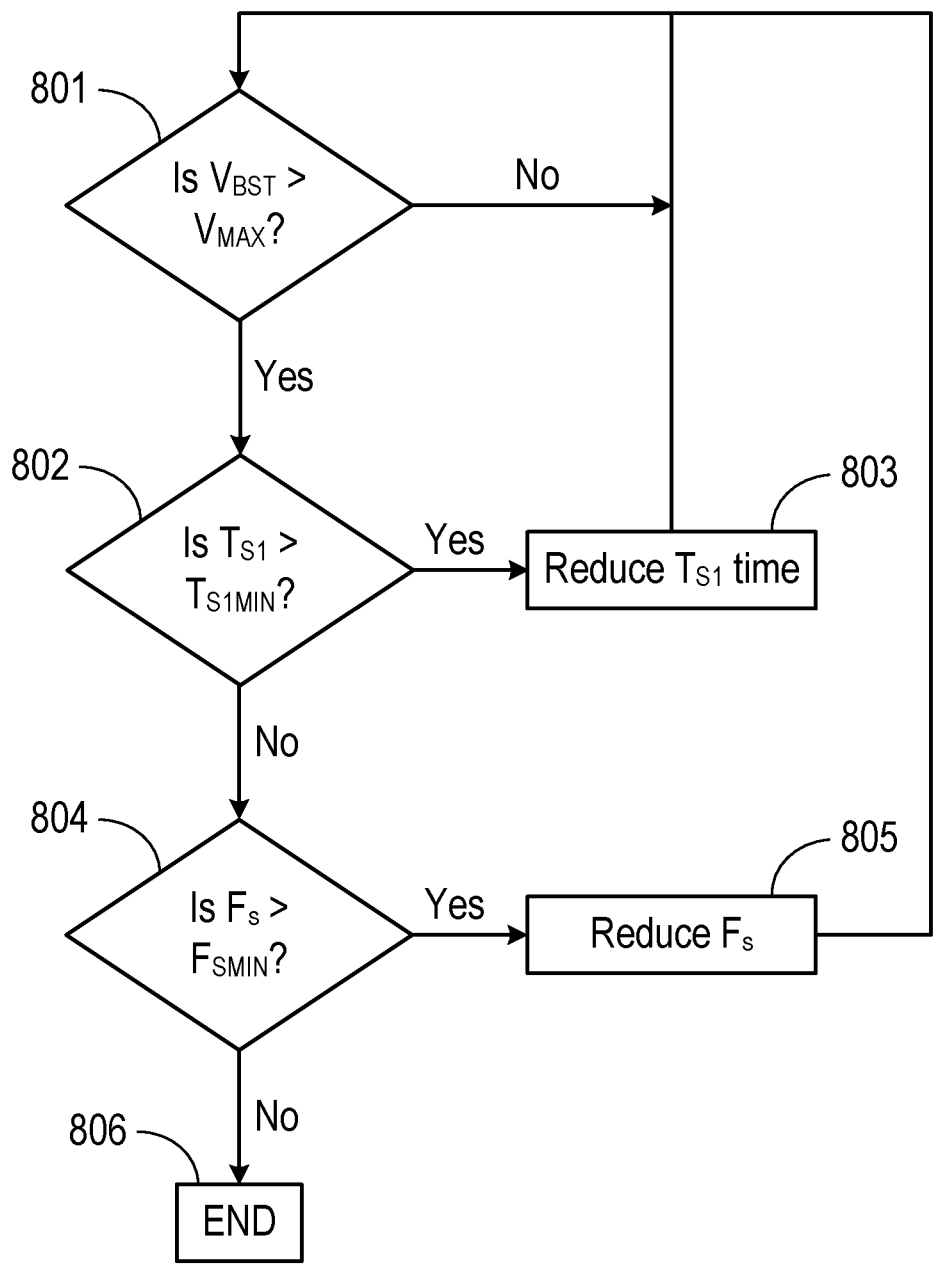
FIG. 8 is an example flow chart illustrating a method of reducing the duty cycle of a DC-DC converter to maintain the boost voltage within a predetermined voltage range, in accordance with embodiments of the present disclosure.

FIG. 8 illustrates a method of reducing the duty cycle of a DC-DC converter to maintain the boost voltage within a predetermined voltage range according to some embodiments.

In particular, the embodiment shown in FIG. 8 performs the steps of responsive to the output voltage being above the predetermined voltage range when using the first switching frequency, first decreasing the duty cycle by decreasing the on time of the DC-DC converter until a minimum duty cycle for the first switching frequency is reached, and responsive to the output voltage remaining above the predetermined voltage range when using the first switching frequency, switching to the second switching frequency.

In step 801 the DC-DC converter determines whether the boost voltage $V_{BST}$ is above the maximum voltage threshold $V_{MAX}$. If the boost voltage $V_{BST}$ is below the threshold $V_{MAX}$ the method returns to the start.

If in step 801 the DC-DC converter determines that the boost voltage $V_{BST}$ is above the maximum threshold $V_{MAX}$, the method passes to step 802 in which the DC-DC converter determines whether an on time $T_{S1}$ that the DC-DC converter in the state $S_1$, is greater than a minimum value, $T_{S1MIN}$. An on time of the DC-DC converter may be considered a period of time during which the current across the inductor of the DC-DC converter is being increased. In the example illustrated in FIG. 4, this on time may be understood as the period that the DC-DC convertor remains in the state $S_1$, i.e. the time for which the NFET is in a conducting state.

The minimum on time $T_{S1MIN}$ may be a minimum duty cycle for the frequency at which the DC-DC converter is operating.

If in step 802 the DC-DC converter determines that the on time $T_{S1}$ of the DC-DC converter is greater than $T_{S1MIN}$, then the method passes to step 803 in which the DC-DC converter reduces the on time of the DC-DC converter. The method will then return to the start. In some embodiments, the on time of the DC-DC converter may be reduced by a predetermined increment.

If in step 802 the DC-DC converter determines that the on time $T_{S1}$ of the DC-DC converter is not greater than the minimum on time $T_{S1MIN}$, the method then passes to step 804 in which the DC-DC converter determines whether the switching frequency $F_S$ is greater than a minimum switching frequency $F_{SMIN}$.

If in step 804 the DC-DC converter determines that the switching frequency $F_S$ is greater than the minimum switching frequency $F_{SMIN}$, the method passes to step 805 in which the DC-DC converter reduces the switching frequency. In some embodiments, the switching frequency may be decreased by increasing the time period of the switching frequency by one clock period. The method may then pass back to the start. In other words, by decreasing the switching frequency the DC-DC convertor switches from the first switching frequency to the second switching frequency.

If in step 804 the DC-DC converter determines that the switching frequency $F_s$ is not greater than the minimum switching frequency, the method may end in step 806.

It will be appreciated that the steps 801 to 805 may be performed iteratively until either the voltage has dropped below the maximum threshold $V_{MAX}$ or both the minimum on time $T_{S1MIN}$ and the minimum switching frequency $F_{SMIN}$ have been reached.

In some embodiments the switching frequency may be decreased from a starting frequency $F_{START}$ by increasing N by one in the following equation:

$$F_N=(F_{START})/(N+1)$$

Figure 9:
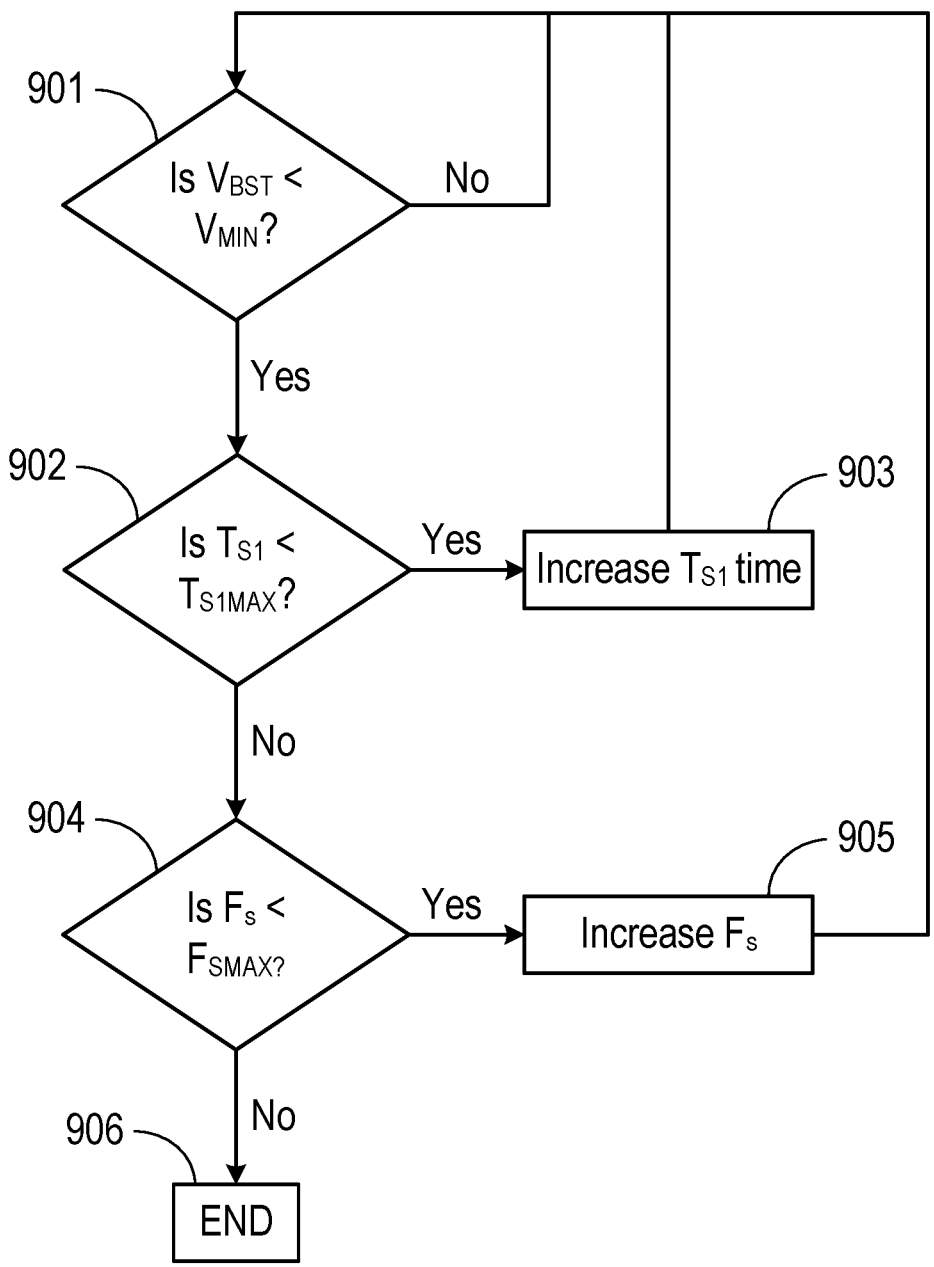
FIG. 9 is an example flow chart illustrating a method of increasing the duty cycle of a DC-DC converter to maintain the boost voltage within a predetermined voltage range, in accordance with embodiments of the present disclosure.

FIG. 9 illustrates a method of increasing the duty cycle of a DC-DC converter to maintain the boost voltage within a predetermined voltage range according to some embodiments.

The embodiment illustrated in FIG. 9 performs the steps of, responsive to the output voltage being below the predetermined voltage range when using the second switching frequency, first increasing the duty cycle by increasing an on time of the DC-DC converter until a maximum duty cycle for the second switching frequency is reached, and responsive to the output voltage remaining below the predetermined voltage range when using the second switching frequency, switching to the first switching frequency.

In step 901, the DC-DC converter determines whether the boost voltage $V_{BST}$ is below the minimum voltage threshold $V_{MIN}$. If the boost voltage $V_{BST}$ is above the minimum threshold $V_{MIN}$ the method returns to the start.

If in step 901, the DC-DC converter determines that the boost voltage $V_{BST}$ is below the minimum threshold $V_{MIN}$, the method passes to step 902 in which the DC-DC converter determines whether an on time of the DC-DC converter, $T_{S1}$, is less than a maximum value, $T_{S1MAX}$. An on time of the DC-DC converter may be defined as a period of time during which the current across the inductor of the DC-DC converter is being increased. In the example illustrated in FIG. 4, this on time may be understood as the period during which the DC-DC converter is in state $S_1$, i.e. the time for which the NFET is in a conducting state.

The maximum on time $T_{S1MAX}$ may be a maximum duty cycle for the frequency at which the DC-DC converter is operating.

If in step 902 the DC-DC converter determines that the on time $T_{S1}$ of the DC-DC converter is less than $T_{S1MAX}$, then the method passes to step 903 in which the DC-DC converter increases the on time $T_{S1}$ of the DC-DC converter. The method will then return to the start. In some embodiments, the on time $T_{S1}$ of the DC-DC converter may be increased by a predetermined increment.

If in step 902 the DC-DC converter determines that the on time $T_{S1}$ of the DC-DC converter is not less than the maximum on time $T_{S1MAX}$, the method then passes to step 904 in which the DC-DC converter determines whether the switching frequency $F_S$ is less than a maximum switching frequency $F_{SMAX}$.

If in step 904 the DC-DC converter determines that the switching frequency $F_S$ is less than the maximum switching frequency $F_{SMAX}$, the method passes to step 805 in which the DC-DC converter increases the switching frequency. In some embodiments, the switching frequency may be increased by decreasing the time period of the switching frequency by one clock period. The method may then pass back to the start. In other words, by increasing the switching frequency, the DC-DC convertor switches from the second switching frequency to the first switching frequency.

If in step 904 the DC-DC converter determines that the switching frequency $F_s$ is not less than the maximum switching frequency $F_{SMAX}$, the method may end in step 806.

It will be appreciated that the steps 901 to 905 may be performed iteratively until either the voltage has risen above the minimum threshold $V_{MIN}$ or both the maximum on time $T_{S1MAX}$ and the maximum switching frequency $F_{SMAX}$ have been reached.

In some embodiments the switching frequency may be increased from a starting frequency $F_{START}$ by decreasing N by one in the following equation:

$$F_N=(F_{START})/(N+1)$$

Figure 10:
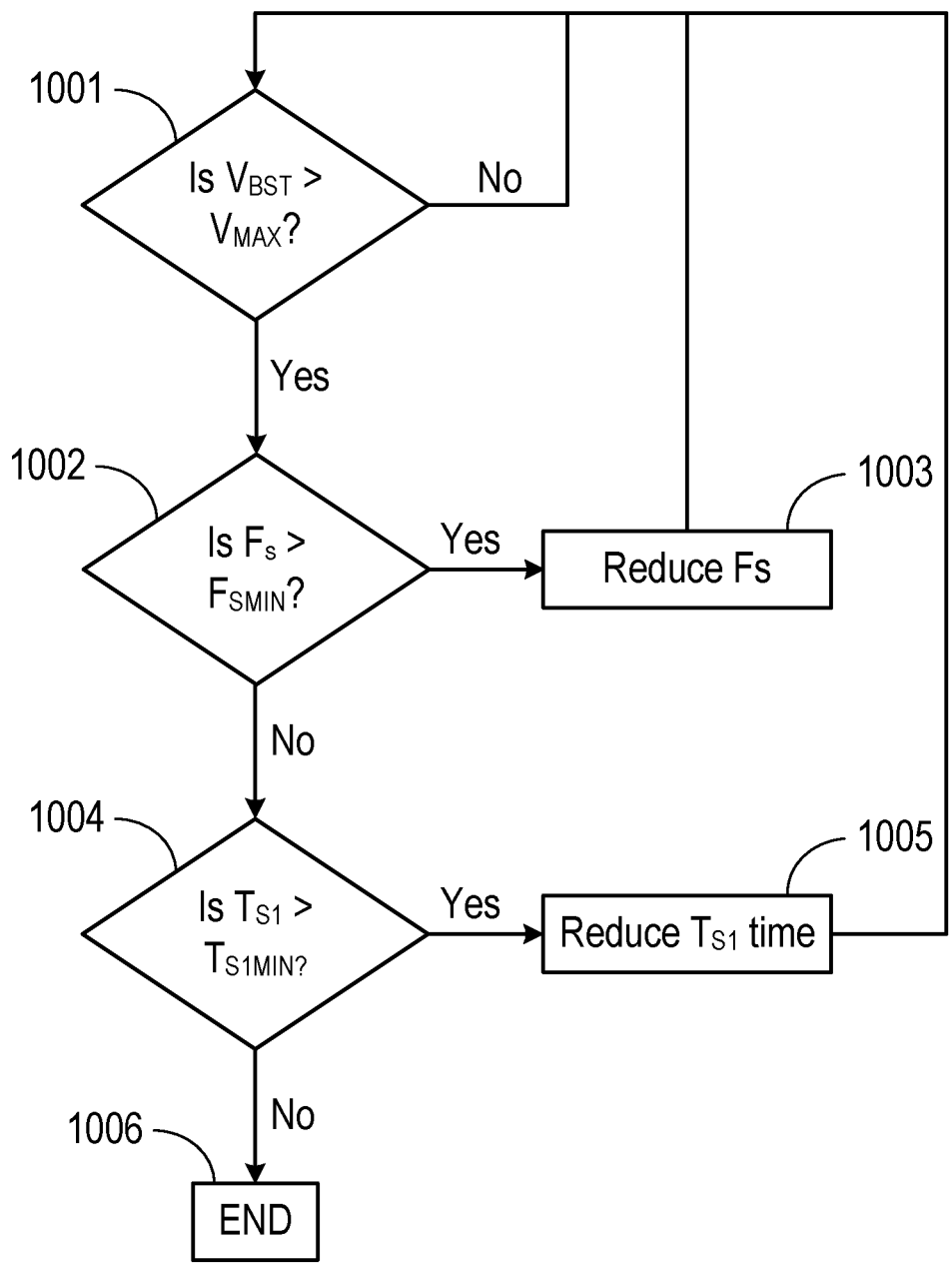
FIG. 10 is an example flow chart illustrating a method of reducing the duty cycle of a DC-DC converter to maintain the boost voltage within a predetermined voltage range, in accordance with embodiments of the present disclosure.

FIG. 10 illustrates a method of reducing the duty cycle of a DC-DC converter to maintain the boost voltage within a predetermined voltage range according to some embodiments.

In particular, the embodiment shown in FIG. 10 performs the steps of responsive to the output voltage being above the predetermined voltage range when using the first switching frequency, first switching to the second switching frequency; and responsive to the output voltage remaining above the predetermined voltage range when using the second switching frequency, decreasing the duty cycle by decreasing the on time of the DC-DC converter until a minimum duty cycle for the second switching frequency is reached.

In step 1001 the DC-DC converter determines whether the boost voltage $V_{BST}$ is above the maximum voltage threshold $V_{MAX}$. If the boost voltage $V_{BST}$ is below the threshold $V_{MAX}$, the method returns to the start.

If in step 1001 the DC-DC converter determines that the boost voltage $V_{BST}$ is above the maximum threshold $V_{MAX}$, the method passes to step 1002 in which the DC-DC converter determines whether the switching frequency $F_S$ is greater than a minimum switching frequency $F_{SMIN}$.

If in step 1002 the DC-DC converter determines that the switching frequency $F_S$ is greater than the minimum switching frequency $F_{SMIN}$, the method passes to step 1003 in which the DC-DC converter reduces the switching frequency. In some embodiments, the switching frequency may be decreased by increasing the time period of the switching frequency by one clock period. In other words, by reducing the switching frequency the DC-DC convertor switches from using the first switching frequency to using a second switching frequency. The method may then pass back to the start.

If in step 1002 the DC-DC converter determines that the switching frequency $F_s$ is not greater than the minimum switching frequency, the method pass to step 1004 in which the DC-DC converter the DC-DC converter determines whether an on time $T_{S1}$ during which the DC-DC converter is in state $S_1$, is greater than a minimum value, $T_{S1MIN}$. An on time $T_{S1}$ of the DC-DC converter may be considered a period of time during which the current across the inductor of the DC-DC converter is being increased. In the example illustrated in FIG. 4, this on time $T_{S1}$ may be understood as the period during which the DC-DC converter is in state $S_1$, i.e. the time for which the NFET is in a conducting state.

The minimum on time $T_{S1MIN}$ may be a minimum duty cycle for the frequency at which the DC-DC converter is operating.

If in step 1004 the DC-DC converter determines that the on time $T_{S1}$ of the DC-DC converter is greater than $T_{S1MIN}$, then the method passes to step 1005 in which the DC-DC converter reduces the on time of the DC-DC converter. The method will then return to the start. In some embodiments, the on time of the DC-DC converter may be reduced by a predetermined increment.

If in step 1004 the DC-DC converter determines that the on time $T_{S1}$ of the DC-DC converter is not greater than the $T_{S1MIN}$, the method may end in step 1006.

It will be appreciated that the steps 1001 to 1005 may be performed iteratively until either the voltage has dropped below the maximum threshold $V_{MAX}$ or both the minimum on time $T_{S1MIN}$ and the minimum switching frequency $F_{SMIN}$ have been reached.

In some embodiments the switching frequency may be decreased from a starting frequency $F_{START}$ by increasing N by one in the following equation:

$$F_N = (F_{START})/(N+1).$$

Figure 11:
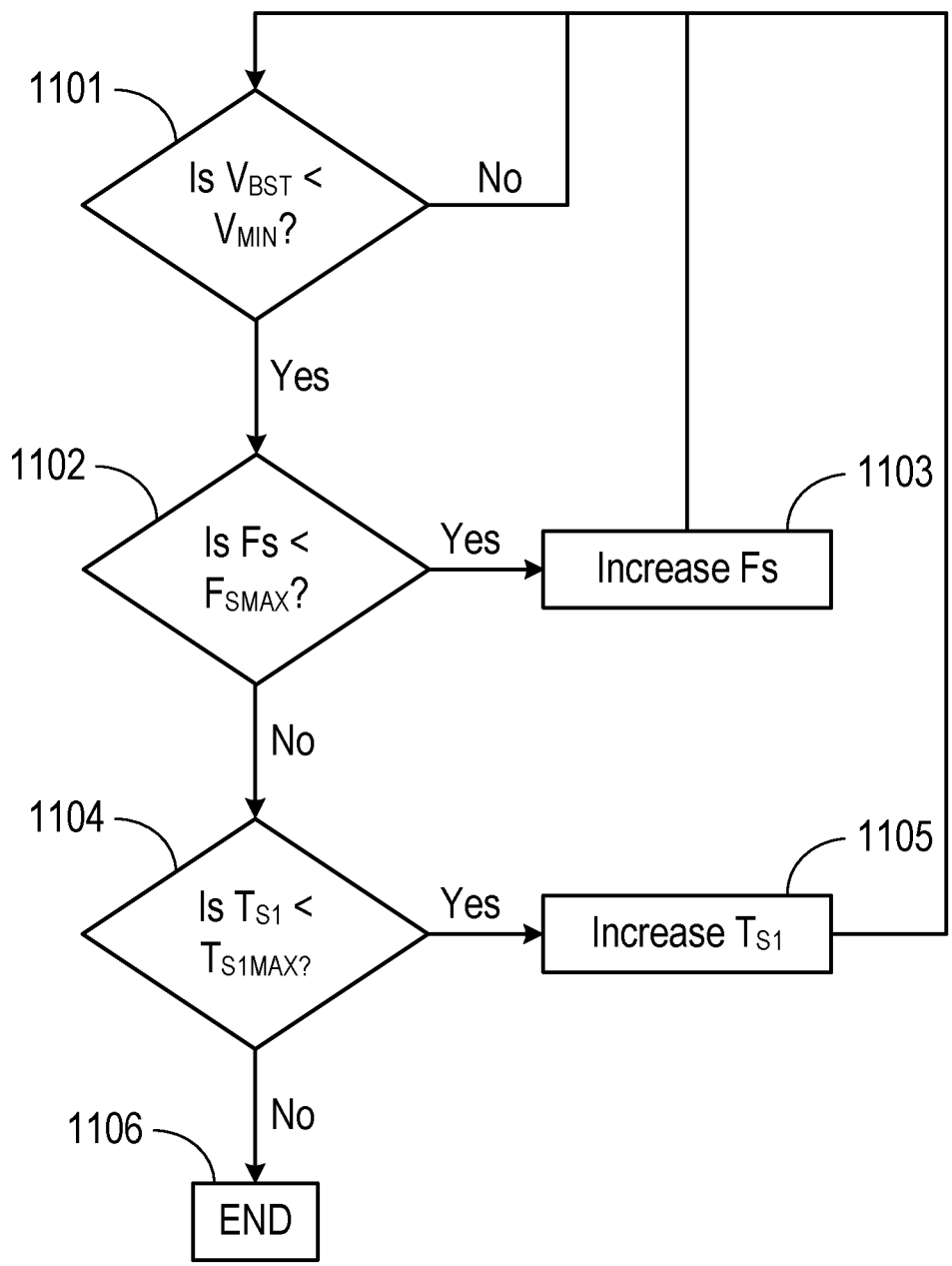
FIG. 11 is an example flow chart illustrating a method of increasing the duty cycle of a DC-DC converter to maintain the boost voltage within a predetermined voltage range, in accordance with embodiments of the present disclosure.

FIG. 11 illustrates a method of increasing the duty cycle of a DC-DC converter to maintain the boost voltage within a predetermined voltage range according to some embodiments.

In particular, the embodiment shown in FIG. 11 performs the steps of responsive to the output voltage being above the predetermined voltage range when using the first switching frequency, first switching to the second switching frequency; and responsive to the output voltage remaining above the predetermined voltage range when using the second switching frequency, decreasing the duty cycle by decreasing the on time of the DC-DC converter until a minimum duty cycle for the second switching frequency is reached.

In step 1101 the DC-DC converter determines whether the boost voltage $V_{BST}$ is below the minimum voltage threshold $V_{MIN}$. If the boost voltage $V_{BST}$ is above the minimum threshold $V_{MIN}$, the method returns to the start.

If in step 1101 the DC-DC converter determines that the boost voltage $V_{BST}$ is below the minimum threshold $V_{MIN}$, the method passes to step 1102 in which the DC-DC converter determines whether the switching frequency $F_S$ is less than a maximum switching frequency $F_{SMAX}$.

If in step 1102 the DC-DC converter determines that the switching frequency $F_S$ is less than the maximum switching frequency $F_{SMAX}$, the method passes to step 1103 in which the DC-DC converter increases the switching frequency. In some embodiments, the switching frequency may be increased by decreasing the time period of the switching frequency by one clock period. In other words, by increasing the switching frequency the DC-DC converter switches from using the first switching frequency to the second switching frequency. The method may then passes back to the start.

If in step 1102 the DC-DC converter determines that the switching frequency $F_s$ is not less than the maximum switching frequency $F_{SMAX}$, the method passes to step 1104 in which the DC-DC converter the DC-DC converter determines whether an on time $T_{S1}$ during which the DC-DC converter is in state $S_1$, is less than a maximum value, $T_{S1MAX}$. An on time $T_{S1}$ of the DC-DC converter may be defined as a period of time during which the current across the inductor of the DC-DC converter is being increased. In the example illustrated in FIG. 4, this may be understood as the period during which the DC-DC converter is in state $S_1$, i.e. the time for which the NFET is in a conducting state.

The maximum on time $T_{S1MAX}$ may be a maximum duty cycle for the frequency at which the DC-DC converter is operating.

If in step 1104 the DC-DC converter determines that the on time $T_{S1}$ of the DC-DC converter is less than $T_{S1MAX}$, then the method passes to step 1105 in which the DC-DC converter increases the on time $T_{S1}$ of the DC-DC converter. The method will then return to the start. In some embodiments, the on time $T_{S1}$ of the DC-DC converter may be increased by a predetermined increment.

If in step 1104 the DC-DC converter determines that the on time $T_{S1}$ of the DC-DC converter is not less than the maximum on time $T_{S1MAX}$, the method may end in step 1106.

It will be appreciated that the steps 1101 to 1105 may be performed iteratively until either the voltage has risen above the minimum threshold $V_{MIN}$ or both the maximum on time $T_{S1MAX}$ and the maximum switching frequency $F_{SMAX}$ have been reached.

In some embodiments the switching frequency may be increased from a starting frequency $F_{START}$ by decreasing N by one in the following equation:

$$F_N = (F_{START})/(N+1).$$

Figure 12:
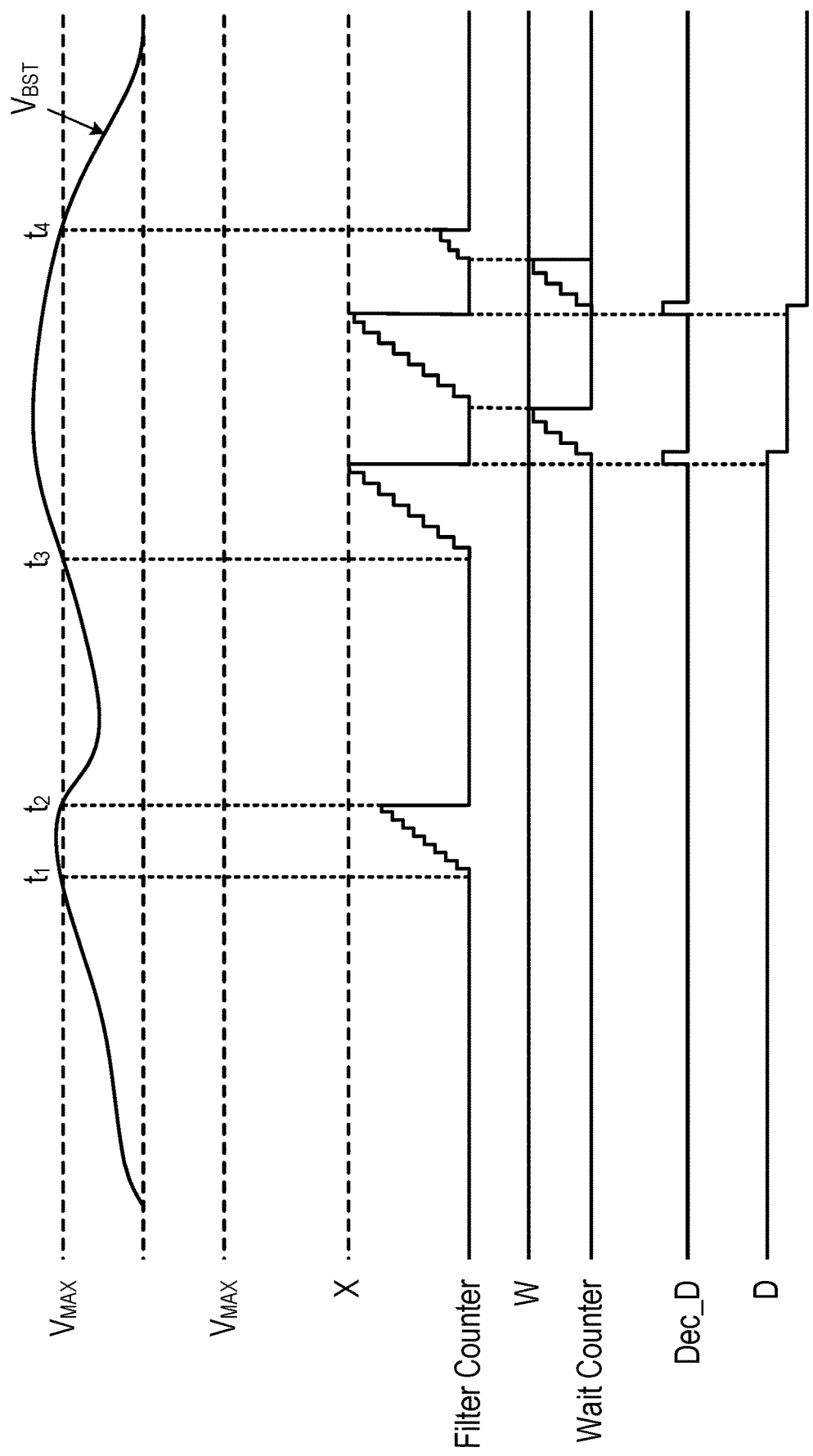
FIG. 12 is an example timing diagram illustrating the operation of a DC-DC converter in accordance with embodiments of the present disclosure.

FIG. 12 illustrates an example of the operation of a DC-DC converter according to some embodiments.

The DC-DC converter monitors the output voltage $V_{BST}$, for example, as illustrated in FIG. 2, the controller 222 may receive an indication of the output voltage $V_{BST}$ via an analog-to-digital converter 220. The controller 222 may then adjust the duty cycle of the DC-DC converter accordingly.

For example, as illustrated in FIG. 12, if at a time $t_1$ the boost voltage $V_{BST}$ goes above a maximum threshold voltage $V_{MAX}$, the controller 222 be configured to determine whether to decrease the duty cycle.

In some embodiments, the DC-DC converter is configured to decrease the duty cycle responsive to the boost voltage $V_{BST}$ remaining above the maximum voltage $V_{MAX}$ for a predetermined time. For example, the controller 222 may comprise a filter counter configured to count clock cycles from when the voltage first passes above the maximum threshold $V_{MAX}$ at a time $t_1$, until the amplitude passes back below the maximum threshold at a time $t_2$. In this example, at the time $t_2$ the filter counter has not yet counted a predetermined number X of clock cycles. The DC-DC converter may therefore not decrease the duty cycle. This manner of control avoids unnecessary decreasing of the duty cycle due to transient peaks in the boost voltage $V_{BST}$.

However, at time $t_3$ the boost voltage $V_{BST}$ passes back above the maximum threshold $V_{MAX}$, this time for long enough for the filter counter to count X clock cycles twice. In this example, a wait counter is also implemented where the filter counter waits a predetermined time between counting each set of X clock cycles. The controller therefore decreases the duty cycle twice after each time the filter counter counts X clock cycles. The boost voltage passes below the maximum threshold at time $t_4$ before the filter counter can count X clock cycles for a third time, and therefore the duty cycle is not decreased a third time.

It will be appreciated that the duty cycle may be decreased as described with respect to FIG. 8 or 10 by decreasing the on time of the DC-DC converter and/or the switching frequency.

It will be appreciated that the DC-DC converter may be equivalently configured to increase the duty cycle responsive to the boost voltage remaining below the minimum voltage $V_{MIN}$ for a predetermined time. For example, the controller 222 may comprise a filter counter configured to count clock cycles from when the voltage first passes below the minimum threshold $V_{MIN}$ to when the voltage passes back above the threshold $V_{MIN}$. Again, if the filter counter does not reach a predetermined number of clock cycles Y (where Y may or may not be equal to X) in this time, the controller may be configured not to increase the duty cycle. This manner of control avoids unnecessary increasing of the duty cycle due to transient troughs in the boost voltage $V_{BST}$.

Again, it will be appreciated that the duty cycle may be increased as described with respect to FIG. 9 or 11 by increasing the on time of the DC-DC converter and/or the switching frequency.

Figure 13:
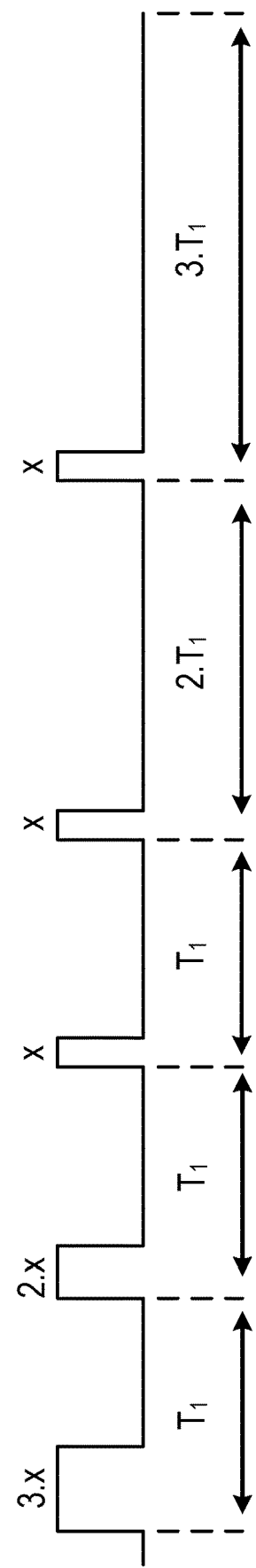
FIG. 13 is an example timing diagram illustrating the NFET 206 conducting and non-conducting states as the duty cycle is decreased in accordance with embodiments of the present disclosure.

FIG. 13 illustrates the NFET 206 conducting and non-conducting states as the duty cycle is decreased. In this example, the duty cycle is decreased according to the method described in FIG. 8, but it will be appreciated that the duty cycle may be increased or decreased according to any of the methods described above.

At first, in this example, the duty cycle is $3x/T_1$. The duty cycle is then decreased to $2x/T_1$ by decreasing the on time of the DC-DC converter from $3x$ to $2x$. The duty cycle is then decreased to $x/T_1$ by decreasing the on time of the DC-DC converter from $2x$ to $x$.

As x is the minimum on time for the DC-DC converter, the duty cycle is then decreased to $x/(2T_1)$ by decreasing the switching frequency from $1/T_1$ to $1/(2T_1)$. Again, the duty cycle may be further decreased from $x/(2T_1)$ to $x/(3T_1)$ by decreasing the switching frequency from $1/(2T_1)$ to $1/(3T_1)$.

Figure 14A:
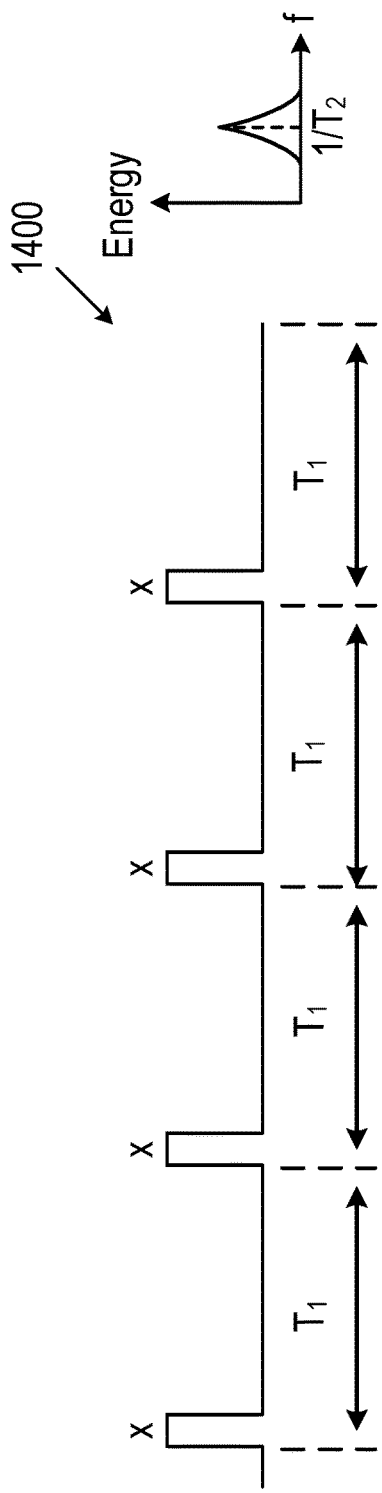
FIGS. 14A and 14B are example timing diagrams illustrating the energy as a function of frequency for different frequencies using the same duty cycle in accordance with embodiments of the present disclosure.
Figure 14B:
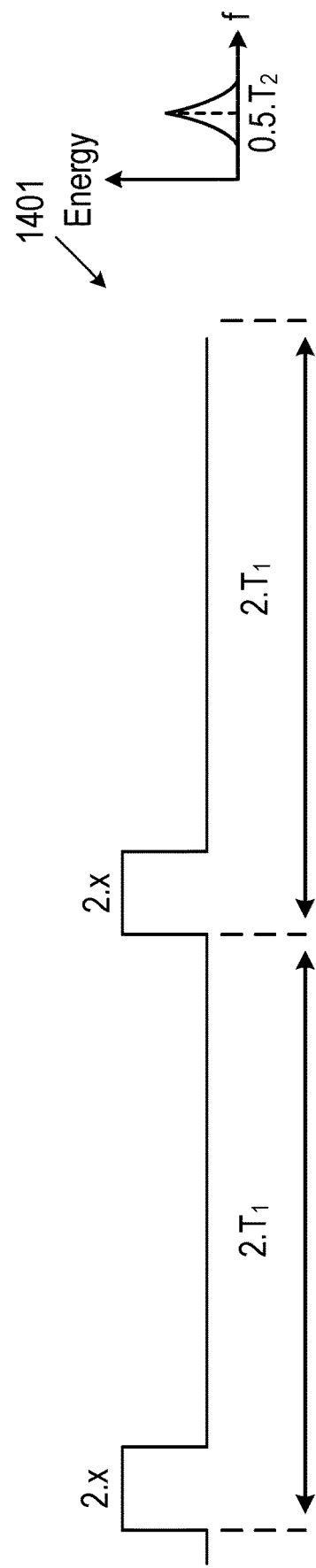

FIGS. 14A and 14B illustrate the energy as a function of frequency for different frequencies using the same duty cycle.

Another possible reason to alter the switching frequency of the DC-DC converter may be to change the concentration of the energy within the frequency band as illustrated in FIGS. 14A and 14B.

In FIG. 14A, the NFET on and off times are illustrated. The duty cycle is $x/T_1$ and the switching frequency is $1/T_1$. The graph 1300 illustrates how the energy is therefore concentrated around the frequency $1/T_1$.

In FIG. 14B, the duty cycle is $2x/2T_1$ which is equivalent to $x/T_1$, in other words, the same as in FIG. 14A. However, the switching frequency is $1/(2T_1)$. The graph 1401 therefore illustrates how the energy is now concentrated around the lower frequency of $1/(2T_1)$.

As the energy in the frequency band may be altered by changing the switching frequency, as illustrated in FIG. 14. If, for example, a concentration of energy is desired that is concentrated around a frequency $1/T_1$ but in this example $1/T_1$ is not an allowed switching frequency, in other words the frequency $1/T_1$ falls within the predefined disallowed frequency band, then two or more allowable switching frequencies which do not fall within the predefined disallowed frequency band, falling either side of the desired switching frequency, may be utilized to create the same energy distribution around the switching frequency $1/T_1$.

Figure 15:
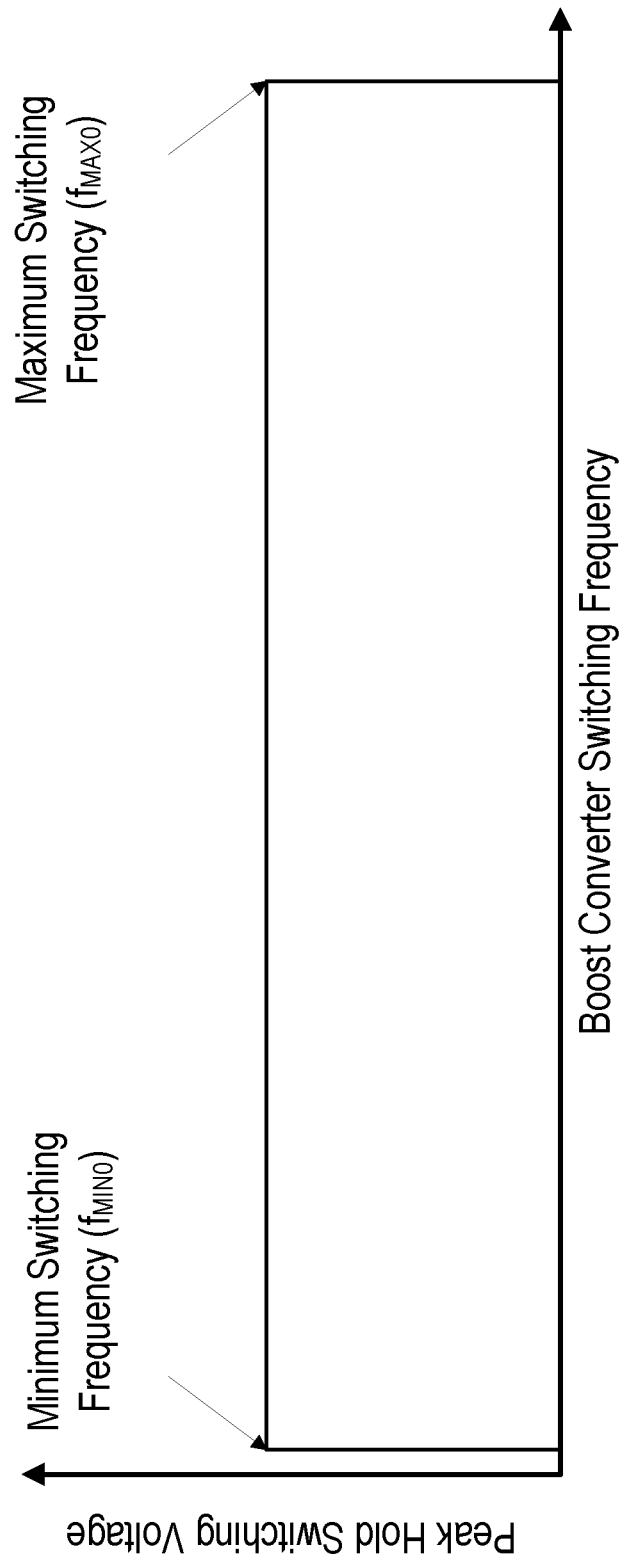
FIG. 15 is an example graph illustrating the switching frequencies available to the boost converter when unconstrained by any predefined disallowed frequency band containing disallowed frequencies in accordance with embodiments of the present disclosure.

FIG. 15 illustrates the switching frequencies available to the boost converter when unconstrained by any predefined disallowed frequency band containing disallowed frequencies. As illustrated, the boost converter has a minimum and maximum possible switching frequency. In this example, $f_{MIN0}$ is the minimum switching frequency of the boost converter when allowed to operate without any predefined disallowed frequency bands containing disallowed frequencies. In this example, $f_{MAX0}$ is the maximum switching frequency of the boost converter when allowed to operate without any predefined disallowed frequency bands containing disallowed frequencies.

Figure 16:
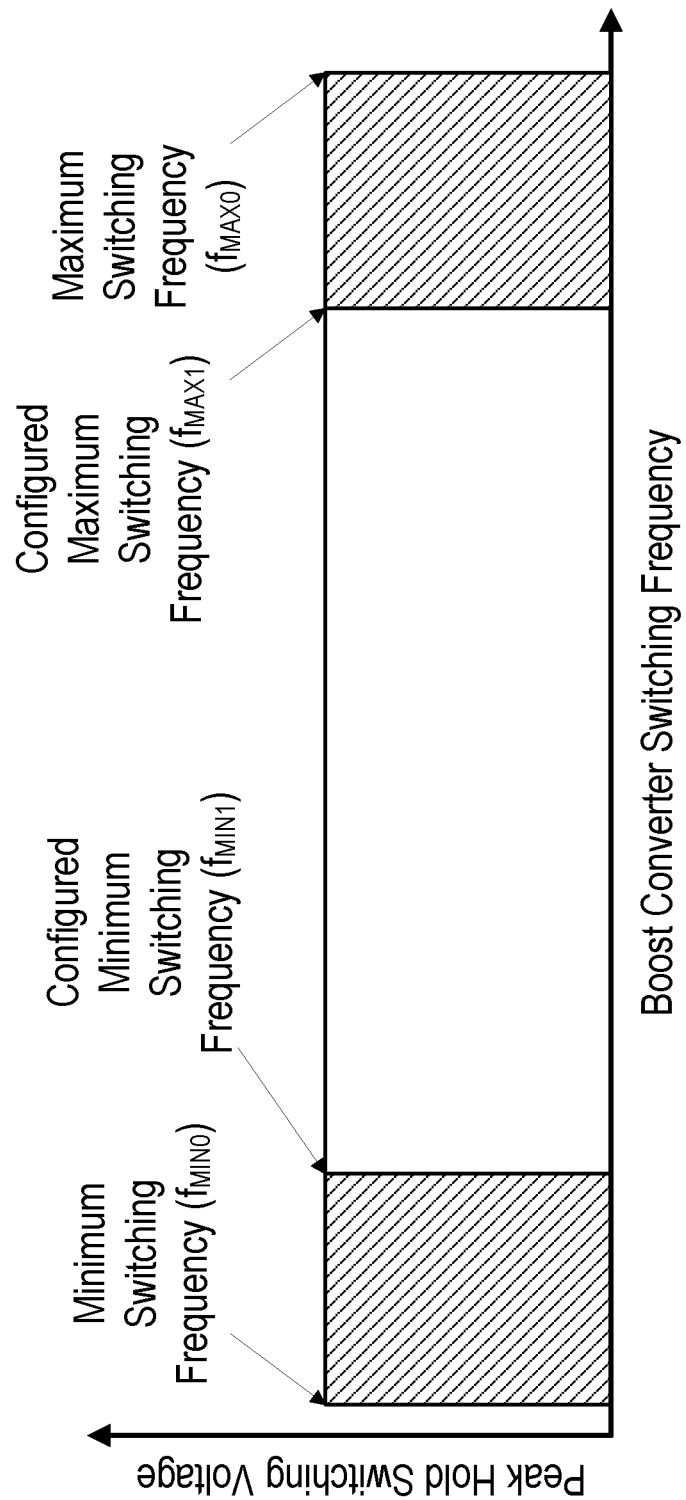
FIG. 16 is a graph illustrating an example where two predefined disallowed frequency bands have been set containing disallowed frequencies in accordance with the present disclosure.

FIG. 16 illustrates an example where two predefined disallowed frequency bands have been set containing disallowed frequencies. In this example, a first predefined disallowed frequency band between $f_{MIN0}$ and a frequency $f_{MIN1}$ is introduced and a second predefined disallowed frequency band between $f_{MAX1}$ and $f_{MAX0}$ is introduced. The values $f_{MIN1}$ and $f_{MAX1}$ are then set as maximum and minimum switching frequencies for the boost converter in order to ensure that the boost converter does not use switching frequencies in either of the predefined disallowed frequency bands. In this example, the predefined disallowed frequency bands sit at either end of the allowed switching frequencies.

Figure 17:
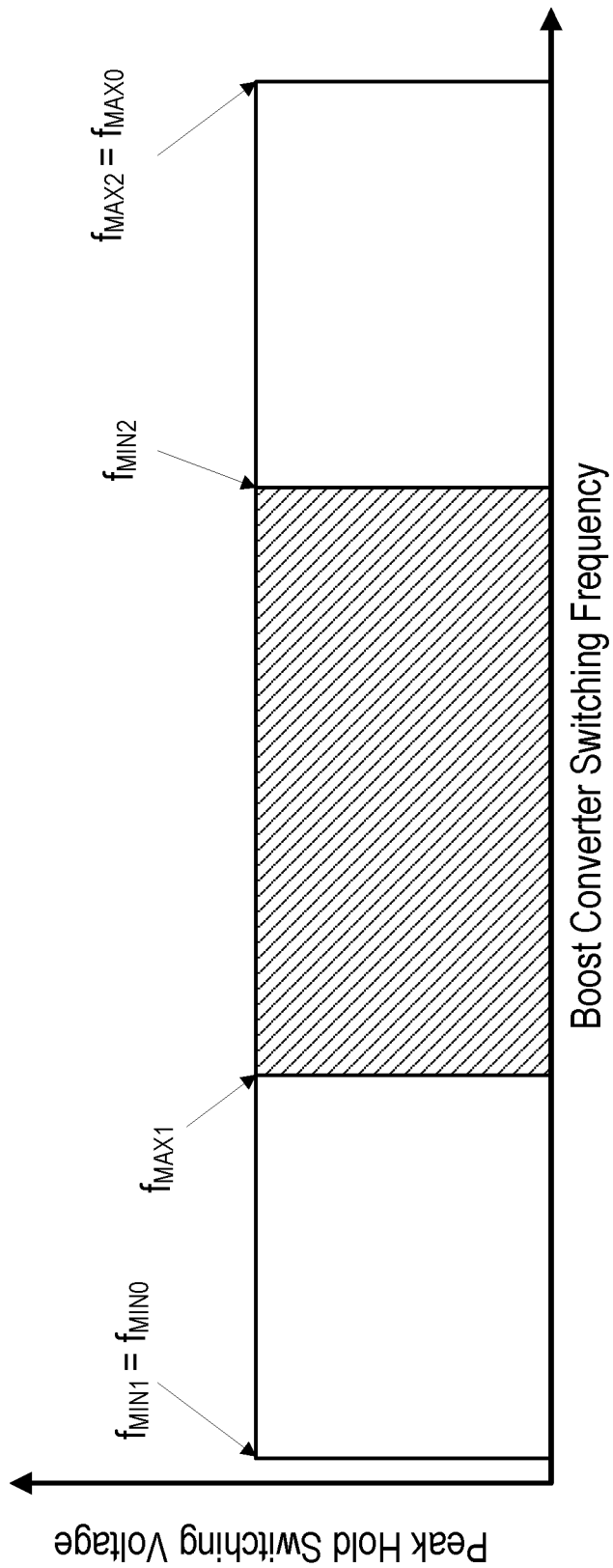
FIG. 17 is a graph illustrating an example comprising a single predefined disallowed frequency band in accordance with the present disclosure.

FIG. 17 illustrates an example comprising a single predefined disallowed frequency band has been set containing disallowed frequencies. In this example, the predefined disallowed frequency band falls between the frequencies $f_{MAX1}$ and $f_{MIN1}$. The frequencies between $f_{MAX1}$ and $f_{MIN1}$ may therefore be considered as disallowed. Two frequency bands are provided that the boost converter may use between $f_{MIN0}$ and $f_{MAX1}$ and $f_{MIN2}$ and $f_{MAX0}$. In this example therefore, the boost converter may select a frequency between $f_{MIN0}$ and $f_{MAX1}$ and $f_{MIN2}$ and $f_{MAX0}$. In circumstances where the desired energy concentration is between $f_{MAX1}$ and $f_{MIN2}$, the boost converter may select a frequency between $f_{MIN0}$ and $f_{MAX1}$ and a different frequency between $f_{MIN2}$ and $f_{MAX0}$ and may then alternate between the two switching frequencies in such a way that the energy may be concentrated between the frequencies $f_{MAX1}$ and $f_{MIN2}$.

In some embodiments therefore, the DC-DC converter may be configured to alternate between a first switching frequency and a second switching frequency wherein the first switching frequency is higher than the predefined disallowed frequency band and the second switching frequency is lower than the predefined disallowed frequency band.

Figure 18:
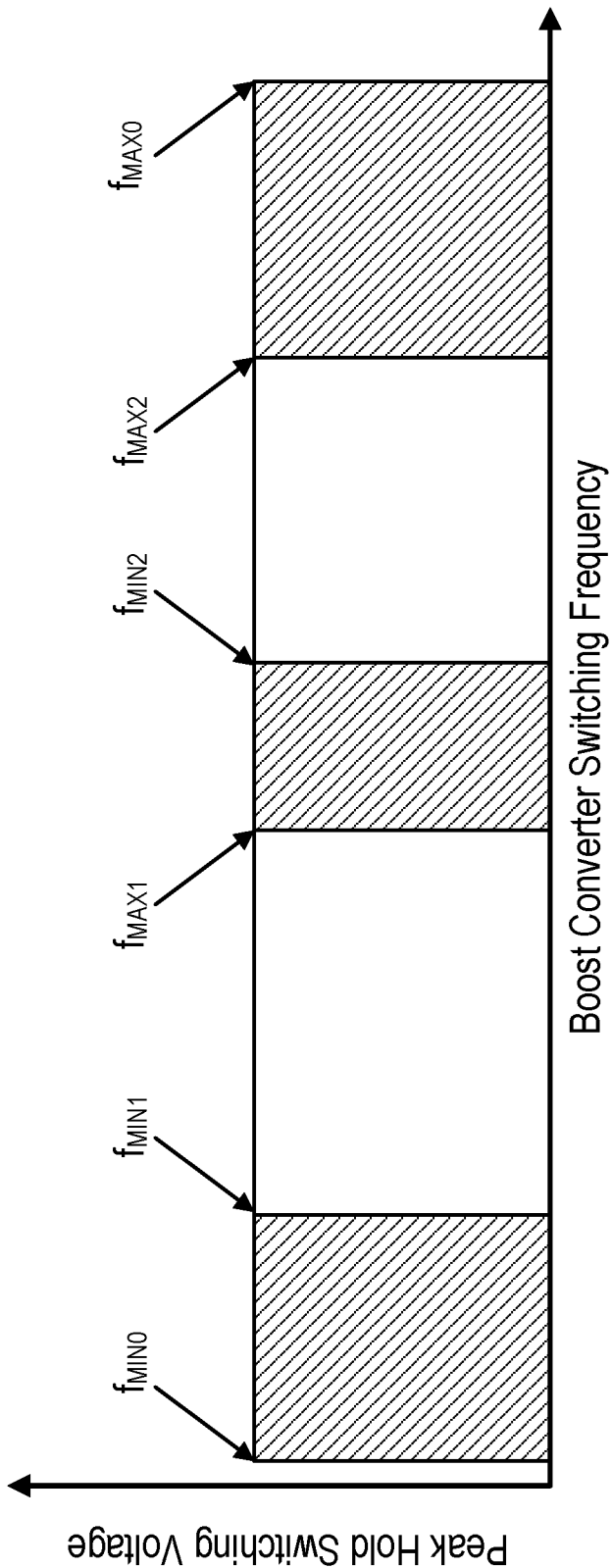
FIG. 18 is graph illustrating an example comprising three predefined disallowed frequency bands in accordance with the present disclosure.

FIG. 18 illustrates an example comprising three predefined disallowed frequency bands. In this example, a first predefined disallowed frequency band falls between $f_{MIN0}$ and a frequency $f_{MIN1}$ and a second frequency band falls between $f_{MAX2}$ and $f_{MAX0}$. These disallowed frequency bands are equivalent to those illustrated in FIG. 16 in that they are at the ends of the possible frequencies that the boost converter is capable of using. However, in this example, the predefined disallowed frequency band between $f_{MAX1}$ and $f_{MIN2}$ is also disallowed. In this example, therefore only the frequencies between $f_{MIN1}$ and $f_{MAX1}$ and the frequencies between $f_{MIN2}$ and $f_{MAX2}$ may be used by the boost converter. Similarly to as described with regards to FIG. 17, the boost converter may alternate between a switching frequency between $f_{MIN1}$ and $f_{MAX1}$ and a switching frequency between $f_{MIN2}$ and $f_{MAX2}$ in order to concentrate the energy between the frequencies $f_{MAX1}$ and $f_{MIN2}$.

Figure 19:
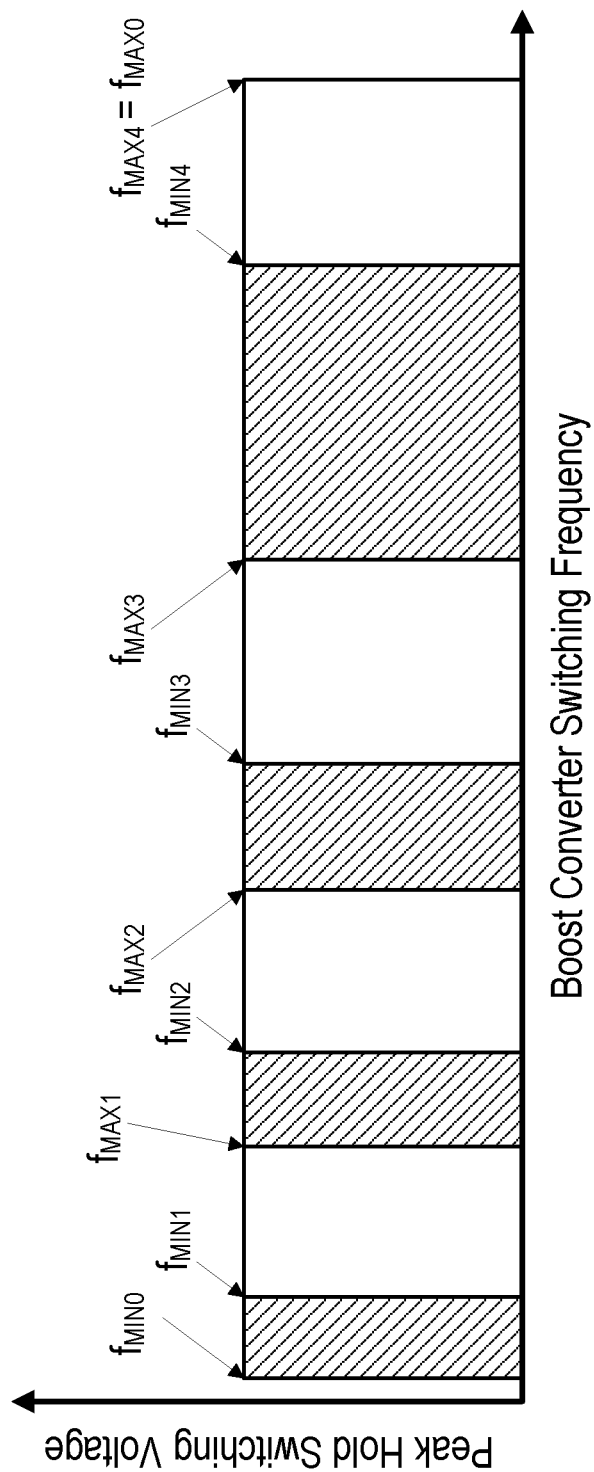
FIG. 19 is graph illustrating an example comprising four predefined disallowed frequency bands in accordance with the present disclosure.

FIG. 19 illustrates an example comprises four predefined disallowed frequency bands. In this example, the frequencies between $f_{MIN0}$ and $f_{MIN1}$ between $f_{MAX1}$ and $f_{MIN2}$, between $f_{MAX2}$ and $f_{MIN3}$ and between $f_{MAX3}$ and $f_{MIN4}$ are disallowed.

As previously, the boost convertor may alternate between frequencies outside of these predefined disallowed frequency bands containing disallowed frequencies to concentrate the energy within the predefined disallowed frequency bands without actually using the frequencies within those predefined disallowed frequency bands.

Figure 20:
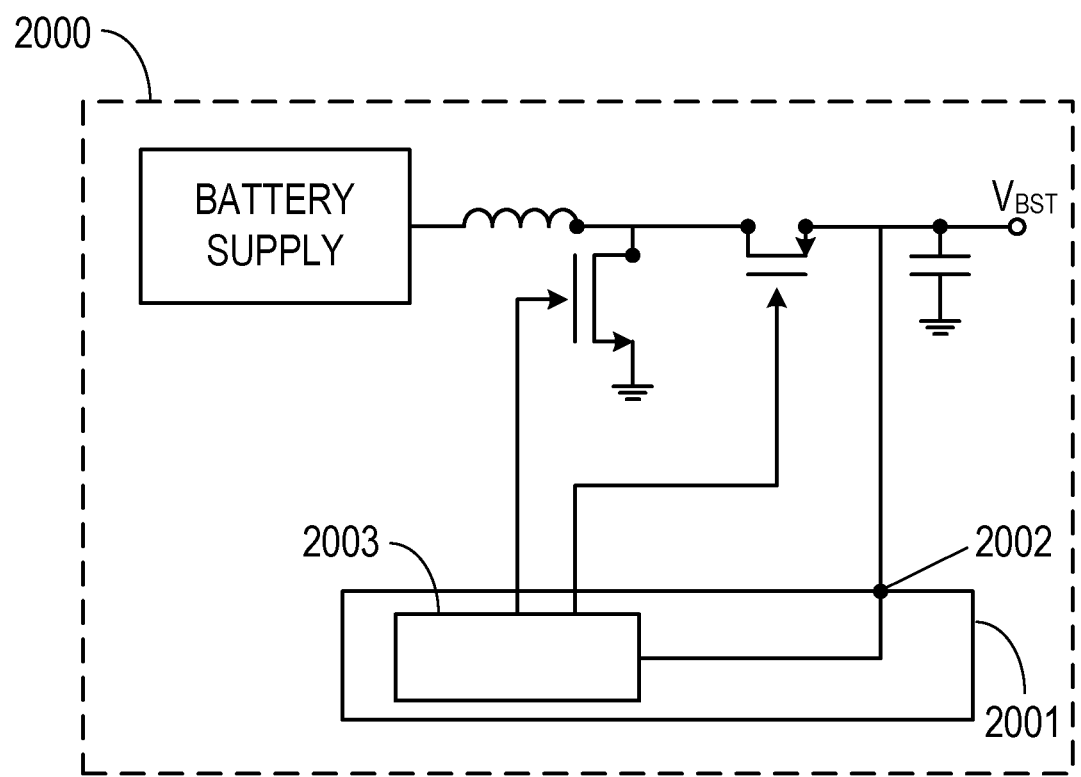
FIG. 20 is an example block diagram of a DC-DC converter 1800 in accordance with the present disclosure.

FIG. 20 illustrates a DC-DC converter 2000 according to some embodiments. The DC-DC converter 2000 comprises a controller 2001. The controller 2001 comprises an input 2002 configured to receive an indication of the output voltage.

The controller 2001 further comprises an adjustment block 2003 configured to adjust a duty cycle of the DC-DC converter based on the output voltage to maintain the output voltage within a predetermined voltage range. The duty cycle of the DC-DC converter is adjusted by switching between a first switching frequency to a second switching frequency. The first switching frequency and the second switching frequency are selected such that the first switching frequency and the second switching frequency fall outside of at least one predefined disallowed frequency band. As described previously, the at least one predefined disallowed frequency band may comprise disallowed frequencies.

There is therefore provided methods and apparatus for maintaining an output voltage of a DC-DC converter, configured to operate in a discontinuous conduction mode, within a predetermined voltage range.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

The invention claimed is:

1. A method for maintaining an output voltage of a DC-DC converter, configured to operate in a discontinuous conduction mode, within a predetermined voltage range, the method comprising:
adjusting a duty cycle of the DC-DC converter based on an output voltage to maintain the output voltage within a predetermined voltage range;
wherein:
the duty cycle of the DC-DC converter is adjusted by switching between a first switching frequency to a second switching frequency;
the first switching frequency and the second switching frequency are selected such that the first switching frequency and the second switching frequency fall outside of at least one predefined disallowed frequency band; and
the DC-DC converter is configured for use in a device and the at least one predefined disallowed frequency band comprises switching frequencies that would give rise to interference or noise that would adversely affect operation of other components in the device.

2. The method of claim 1 wherein the second switching frequency is equal to 1/N of the first switching frequency, wherein N is a positive integer number.

3. The method of claim 1 further comprising:
adjusting the duty cycle of the DC-DC converter by decreasing an on time of the DC-DC converter.

4. The method of claim 3 further comprising: responsive to the output voltage being above the predetermined voltage range when using the first switching frequency, first decreasing the duty cycle by decreasing the on time of the DC-DC converter until a minimum duty cycle for the first switching frequency is reached, and
responsive to the output voltage remaining above the predetermined voltage range when using the first switching frequency, switching to the second switching frequency.

5. The method of claim 4 further comprising:
responsive to the output voltage remaining above the predetermined voltage range when using the second switching frequency, switching to a third switching frequency wherein the third frequency is 1/N+1 times the second frequency, wherein N is a positive integer number.

6. The method of claim 4 further comprising:
responsive to the output voltage being below the predetermined voltage range when using the second switching frequency, first increasing the duty cycle by increasing an on time of the DC-DC converter until a maximum duty cycle for the second switching frequency is reached, and
responsive to the output voltage remaining below the predetermined voltage range when using the second switching frequency, switching to the first switching frequency.

7. The method of claim 6 further comprising:
responsive to the output voltage remaining below the predetermined voltage range when using the first switching frequency, switching to a third switching frequency wherein the third frequency is greater than the first frequency.

8. The method of claim 3 further comprising: responsive to the output voltage being above the predetermined voltage range when using the first switching frequency, first switching to the second switching frequency; and
responsive to the output voltage remaining above the predetermined voltage range when using the second switching frequency, decreasing the duty cycle by decreasing the on time of the DC-DC converter until a minimum duty cycle for the second switching frequency is reached.

9. The method of claim 8 further comprising:
responsive to the output voltage remaining above the predetermined voltage range when using the second switching frequency, switching to a third switching frequency wherein the third frequency is 1/N+1 times the second frequency, wherein N is a positive integer number.

10. The method of claim 3 further comprising:
responsive to the output voltage being below the predetermined voltage range when using the second switching frequency, switching to the first switching frequency; and
responsive to the output voltage remaining below the predetermined voltage range when using the first switching frequency, increasing the duty cycle by increasing an on time of the DC-DC converter until a maximum duty cycle for the first switching frequency is reached.

11. The method of claim 10 further comprising:
responsive to the output voltage remaining below the predetermined voltage range when using the first switching frequency, switching to a third switching frequency wherein the third frequency is greater than the first frequency.

12. The method of claim 1 further comprising:
alternating between the first switching frequency and the second switching frequency, wherein the first switching frequency is higher than the predefined disallowed frequency band and the second switching frequency is lower than the predefined disallowed frequency band.

13. The method of claim 1 wherein the at least one predefined disallowed frequency band comprises two or more separate predefined disallowed frequency bands.

14. A DC-DC converter configured to in a discontinuous conduction mode and to maintain an output voltage within a predetermined voltage range, the DC-DC converter comprising a controller, wherein the controller comprises:
an input configured to receive an indication of the output voltage; and
an adjustment block configured to adjust a duty cycle of the DC-DC converter based on the output voltage to maintain the output voltage within a predetermined voltage range;
wherein:
the duty cycle of the DC-DC converter is adjusted by switching between a first switching frequency to a second switching frequency;
the first switching frequency and the second switching frequency are selected such that the first switching frequency and the second switching frequency fall outside of at least one predefined disallowed frequency band; and
the DC-DC converter is configured for use in a device and the at least one predefined disallowed frequency band comprises switching frequencies that would give rise to interference or noise that would adversely affect operation of other components in the device.

15. The DC-DC converter of claim 14 wherein the second switching frequency is equal to 1/N of the first switching frequency, wherein N is a positive integer number.

16. The DC-DC converter of claim 14 wherein the adjustment block is further configured to adjust the duty cycle of the DC-DC converter by decreasing an on time of the DC-DC converter.

17. The DC-DC converter of claim 16 wherein the adjustment block is further configured to: responsive to the output voltage being above the predetermined voltage range when using the first switching frequency, first decrease the duty cycle by decreasing the on time of the DC-DC converter until a minimum duty cycle for the first switching frequency is reached, and responsive to the output voltage remaining above the predetermined voltage range when using the first switching frequency, switch to the second switching frequency.

18. The DC-DC converter of claim 17 wherein the adjustment block is further configured to: responsive to the output voltage remaining above the predetermined voltage range when using the second switching frequency, switch to a third switching frequency wherein the third frequency is 1/N+1 times the second frequency, wherein N is a positive integer number.

19. The DC-DC converter of claim 16 wherein the adjustment block is further configured to:
responsive to the output voltage being below the predetermined voltage range when using the second switching frequency, first increase the duty cycle by increasing an on time of the DC-DC converter until a maximum duty cycle for the second switching frequency is reached, and
responsive to the output voltage remaining below the predetermined voltage range when using the second switching frequency, switch to the first switching frequency.

20. The DC-DC converter of claim 19 wherein the adjustment block is further configured to: responsive to the output voltage remaining below the predetermined voltage range when using the first switching frequency, switch to a third switching frequency wherein the third frequency is greater than the first frequency.

21. The DC-DC converter of claim 16 wherein the adjustment block is further configured to: responsive to the output voltage being above the predetermined voltage range when using the first switching frequency, first switch to the second switching frequency; and
responsive to the output voltage remaining above the predetermined voltage range when using the second switching frequency, decrease the duty cycle by decreasing the on time of the DC-DC converter until a minimum duty cycle for the second switching frequency is reached.

22. The DC-DC converter of claim 21 wherein the adjustment block is further configured to: responsive to the output voltage remaining above the predetermined voltage range when using the second switching frequency, switch to a third switching frequency wherein the third frequency is 1/N+1 times the second frequency, wherein N is a positive integer number.

23. The DC-DC converter of claim 16 wherein the adjustment block is further configured to: responsive to the output voltage being below the predetermined voltage range when using the second switching frequency, switch to the first switching frequency; and
responsive to the output voltage remaining below the predetermined voltage range when using the first switching frequency, increase the duty cycle by increasing an on time of the DC-DC converter until a maximum duty cycle for the first switching frequency is reached.

24. The DC-DC converter of claim 23 wherein the adjustment block is further configured to:
responsive to the output voltage remaining below the predetermined voltage range when using the first switching frequency, switch to a third switching frequency wherein the third frequency is greater than the first frequency.

25. The DC-DC converter of claim 14 wherein the adjustment block is configured to alternate between the first switching frequency and the second switching frequency, wherein the first switching frequency is higher than the predefined disallowed frequency band and the second switching frequency is lower than the predefined disallowed frequency band.

26. The DC-DC converter of claim 14 wherein the at least one predefined disallowed frequency band comprises two or more separate predefined disallowed frequency bands.

\* \* \* \* \*